United States Patent
Kim et al.

(10) Patent No.: US 10,717,927 B2
(45) Date of Patent: Jul. 21, 2020

(54) INDIUM-BASED QUANTUM DOTS AND PRODUCTION METHODS THEREOF

(71) Applicants: SAMSUNG ELECTRONICS CO., LTD., Suwon-si, Gyeonggi-do (KR); UNIVERSITY OF CALIFORNIA, BERKELEY, Berkeley, CA (US)

(72) Inventors: Tae Gon Kim, Hwaseong-si (KR); Yehonadav Bekenstein, Berkeley, CA (US); Eun Joo Jang, Suwon-si (KR); Paul Alivisatos, Berkeley, CA (US)

(73) Assignees: SAMSUNG ELECTRONICS CO., LTD., Gyeonggi-Do (KR); UNIVERSITY OF CALIFORNIA, BERKELEY, Berkeley, CA (US)

( * ) Notice: Subject to any disclaimer, the term of this patent is extended or adjusted under 35 U.S.C. 154(b) by 880 days.

(21) Appl. No.: 15/210,171

(22) Filed: Jul. 14, 2016

(65) Prior Publication Data

US 2018/0016495 A1 Jan. 18, 2018

(51) Int. Cl.
*C09K 11/74* (2006.01)
*C09K 11/72* (2006.01)
(Continued)

(52) U.S. Cl.
CPC ........ *C09K 11/7492* (2013.01); *C09K 11/025* (2013.01); *C09K 11/72* (2013.01);
(Continued)

(58) Field of Classification Search
CPC ..... C09K 11/75; C09K 11/7492; C09K 11/74; C09K 11/70; C09K 11/72; C09K 11/76;
(Continued)

(56) References Cited

U.S. PATENT DOCUMENTS 7,435,418 B2 10/2008 Young et al.
8,357,308 B1 1/2013 Strouse et al.
(Continued)

FOREIGN PATENT DOCUMENTS

JP 11293241 A 10/1999
KR 1020130046308 A 5/2013
(Continued)

OTHER PUBLICATIONS

Byun. Solvothermal synthesis of InP quantum dots and their enhanced luminescent efficiency by post-synthetic treatments. Journal of Colloid and Interface Science 355 (2011) 35-41.*
(Continued)

*Primary Examiner* — Matthew E. Hoban
(74) *Attorney, Agent, or Firm* — Cantor Colburn LLP

(57) ABSTRACT

An indium-containing quantum dot including a compound represented by Chemical Formula 1:

$$In_{1-x}M_xA \qquad \text{Chemical Formula 1}$$

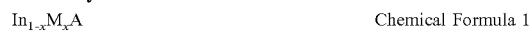

wherein, in Chemical Formula 1, M is aluminum, gallium, yttrium, or scandium, A is nitrogen, phosphorous, arsenic, antimony, bismuth, or a combination thereof, and X is greater than or equal to 0 and less than 1,
wherein the indium-containing quantum dot includes fluorine and oxygen to bonded to a surface of the indium-containing quantum dot,
wherein an amount of the fluorine is greater than or equal to about 10 atomic percent based on a total number of indium atoms in the indium-containing quantum dot as determined by Rutherford backscattering analysis, and
wherein an amount of the oxygen is about 5 atomic percent to about 50 atomic percent based on the total number of indium atoms included in the quantum dot as determined by Rutherford backscattering analysis.

26 Claims, 33 Drawing Sheets

(51) Int. Cl.
*H01L 33/50* (2010.01)
*C09K 11/02* (2006.01)
*H01L 31/0352* (2006.01)
*B82Y 20/00* (2011.01)
*B82Y 40/00* (2011.01)
*B82Y 30/00* (2011.01)

(52) U.S. Cl.
CPC .... *H01L 31/035218* (2013.01); *H01L 33/502* (2013.01); *B82Y 20/00* (2013.01); *B82Y 30/00* (2013.01); *B82Y 40/00* (2013.01); *Y02E 10/52* (2013.01); *Y10S 977/774* (2013.01); *Y10S 977/895* (2013.01); *Y10S 977/95* (2013.01)

(58) Field of Classification Search
CPC .... C09K 11/7428; C09K 11/62; C09K 11/626
See application file for complete search history.

(56) References Cited

U.S. PATENT DOCUMENTS

| | | |
|---|---|---|
| 8,496,844 B1 | 7/2013 | Strouse et al. |
| 8,540,892 B1 | 9/2013 | Strouse et al. |
| 8,663,491 B1 | 3/2014 | Strouse et al. |
| 9,146,419 B1 | 9/2015 | Anandan et al. |
| 9,146,420 B2 | 9/2015 | Gee et al. |
| 2008/0116785 A1* | 5/2008 | Ohno .................... C09K 11/70 313/503 |
| 2014/0009902 A1 | 1/2014 | Banin et al. |
| 2015/0009440 A1 | 1/2015 | Lee et al. |
| 2015/0218442 A1 | 8/2015 | Jun et al. |

FOREIGN PATENT DOCUMENTS

| | | |
|---|---|---|
| KR | 1020150004225 A | 1/2015 |
| KR | 10525525 B1 | 5/2015 |

OTHER PUBLICATIONS

Micic et al., "Highly efficient band-edge emission from InP quantum dots", Appl. Phys. Lett., 68 (22), 1996, pp. 3150-3152.

S. Adam et al., "The effect of nanocrystal surface structure on the luminescence properties: Photoemission study of HF-etched InP nanocrystals", The Journal of Chemical Physics, 123, 2005, pp. 084706-1-084706-10.

* cited by examiner

INDIUM-BASED QUANTUM DOTS AND PRODUCTION METHODS THEREOF

BACKGROUND

1. Field

Indium-based quantum dots and production methods thereof are disclosed.

2. Description of the Related Art

Unlike bulk materials, nanocrystals have physical characteristics (e.g., energy bandgap and melting point) that are intrinsic properties based on their particle size. For example, a semiconductor nanocrystal (also known as a quantum dot) is a semiconductor material having a crystalline structure and a particle size of several nanometers. The semiconductor nanocrystal has a very small particle size and a large surface area per unit volume, and may exhibit a quantum confinement effect. Therefore, the semiconductor nanocrystal has different physicochemical characteristics than a bulk material having the same composition. For example, the quantum dot is capable of controlling its energy band gap depending on its size and composition, and may emit light having high color purity at different wavelengths. Therefore, the quantum dot may find utility in various fields such as displays, energy, a semiconductor, and biology, and thus draws a lot of attention.

The semiconductor nanocrystal may be synthesized by a vapor deposition method such as metal organic chemical vapor deposition ("MOCVD") or molecular beam epitaxy ("MBE"), or by a wet chemical method which includes adding a precursor to an organic solvent to grow crystals. The wet chemical method produces a colloidal quantum dot ("CQD"), wherein organic materials, such as a dispersant, are coordinated to a surface of the semiconductor crystal during the crystal growth to control the crystal growth.

As a nanocrystal particle having a core-shell structure, some quantum dots including cadmium (Cd), lead (Pb), or mercury (Hg) are known to show enhanced luminous and photo-electric efficiency, but they also pose serious environmental threats due to the inclusion of these poisonous heavy metals. Therefore, it is desirable to develop quantum dots that do not include such heavy metals and show enhanced properties.

SUMMARY

An embodiment provides an indium-containing quantum dot having enhanced light emitting properties.

Another embodiment provides a method of producing the indium-containing quantum dot.

Still another embodiment provides an electronic device including the indium-containing quantum dot.

In an embodiment, an indium-containing quantum dot includes a compound represented by Chemical Formula 1:

   Chemical Formula 1 wherein, in Chemical Formula 1, M is aluminum (Al), gallium (Ga), yttrium (Y), or scandium (Sc), A is nitrogen (N), phosphorous (P), arsenic (As), antimony (Sb), bismuth (Bi), or a combination thereof, and X is greater than or equal to 0 and less than 1, wherein the indium-containing quantum dot includes fluorine and oxygen which are bonded to a surface of the indium-containing quantum dot, wherein an amount of the fluorine is greater than or equal to about 10 atomic percent (at. %) based on a total number of indium atoms included in the indium-based quantum dot, as determined by Rutherford backscattering analysis, and wherein an amount of the oxygen is between about 5 at. % and about 50 at. % to based on a total number of indium atoms included in the indium-containing quantum dot, as determined by Rutherford backscattering analysis.

In Chemical Formula 1, A may be phosphorous (P).

In Chemical Formula 1, A may be arsenic (As) or antimony (Sb).

The indium-containing quantum dot may have a ratio of indium atoms to A atoms (In/A) of greater than or equal to about 1.2, as determined by Rutherford backscattering analysis.

The amount of the fluorine may be greater than or equal to about 40 at. % based on the total number of indium atoms included in the indium-containing quantum dot, as determined by Rutherford backscattering analysis.

The amount of the oxygen is about 30 at. % and about 50 at. % based on a total number of indium atoms included in the indium-containing quantum dot, as determined by Rutherford backscattering analysis.

The quantum dot may include a water-miscible organic solvent which is bound to a surface of the indium-containing quantum dot.

The water-miscible organic solvent may include dimethyl sulfoxide (DMSO), dimethyl formamide (DMF), formamide (FA), methyl formamide (MFA), dimethyl acetamide (DMAc), diethylene triamine (DETA), or a combination thereof.

In some embodiments, the indium-containing quantum dot does not include a hydrophobic ligand which is coordinated with a surface thereof, and the hydrophobic ligand includes a trialkylphosphine having at least 24 carbon atoms, a trialkylphosphine oxide having at least 24 carbon atoms, a fatty acid having at least 8 carbon atoms, a thiol compound having at least 8 carbon atoms, an amine having at least 8 carbon atoms, a phosphorous acid having at least 8 carbon atoms, or a to combination thereof.

In some embodiments, the indium-containing quantum dot does not have a shell disposed on the surface of the indium-containing quantum dot, and the shell includes a semiconductor nanocrystal having a greater bandgap energy than the compound represented by Chemical Formula 1.

The quantum dot may include indium on a surface of the indium-containing quantum dot in an amount of greater than or equal to about 10%, based on a total amount of the indium in the quantum dot.

The indium-containing quantum dot may have a quantum yield of greater than or equal to about 10%.

The indium-containing quantum dot may have a photoluminescence peak wavelength that is longer than a photoluminescence peak wavelength of a same quantum dot without the fluorine bonded to the surface.

The photoluminescence peak wavelength of the indium-containing quantum dot may be greater than or equal to about 800 nanometers (nm).

In another embodiment, a method of producing the aforementioned indium-containing quantum dot includes:

providing an indium-containing quantum dot including a compound represented by Chemical Formula 1;

washing the indium-containing quantum dot with a non-solvent;

dispersing the washed indium-containing quantum dot in a mixed solvent including a non-polar solvent and a polar solvent to prepare a quantum dot dispersion;

providing a HF-containing solution; and injecting the HF-containing solution into the quantum dot dispersion to prepare a mixture of the quantum dot dispersion and the HF-containing solution; and irradiating the mixture of the quantum dot dispersion and the HF-containing solution with a light source or heating the mixture of the quantum dot dispersion and the HF-containing solution to produce the indium-containing quantum dot.

The non-solvent may include acetone, ethanol, methanol, isopropyl alcohol, acetonitrile, or a combination thereof.

The polar solvent may include propanol, butanol, or a combination thereof.

The non-polar solvent may include toluene, hexane, cyclohexane, chloroform, or a combination thereof.

In the HF-containing solution, a number of fluorine molecules may be about 10 times to about 10,000 times greater than a number of the indium-containing quantum dots.

In still another embodiment, a method of producing the aforementioned indium-containing quantum dot includes:

providing an indium-containing quantum dot including a compound represented by Chemical Formula 1;

washing the indium-containing quantum dot with a non-solvent;

dispersing the washed indium-containing quantum dot in a first organic solvent which is water immiscible to obtain a first quantum dot dispersion;

dissolving HF in a second organic solvent that is water miscible to obtain an HF solution; and contacting the first quantum dot dispersion with the HF solution; and transferring the indium-containing quantum dots from the first quantum dot to dispersion to the HF solution, to provide a second quantum dot dispersion including the indium-containing quantum dots in the second organic solvent to produce the indium-containing quantum dot.

The contacting of the first quantum dot dispersion with the HF solution may further include heating a mixture of the first quantum dot dispersion and the HF solution or irradiating a mixture of the first quantum dot dispersion and the HF solution with light.

The non-solvent may include acetone, ethanol, methanol, isopropyl alcohol, acetonitrile, or a combination thereof.

The first organic solvent may include hexane, cyclohexane, or a combination thereof.

The second organic solvent may include dimethyl sulfoxide (DMSO), dimethyl formamide (DMF), formamide (FA), methyl formamide (MFA), dimethyl acetamide (DMAc), diethylene triamine (DETA), or a combination thereof.

In the HF solution, a number of fluorine molecules may be about 1000 times to about 1,000,000 times greater than a number of the indium-containing quantum dots.

In another embodiment, a device may include the indium-containing quantum dot.

The device may be a solar cell, a photo-detector, a field effect transistor, a flash memory, or a photoelectric chemical device.

The foregoing indium-containing quantum dot does not include a poisonous heavy metal element such as cadmium, lead, mercury, and the like, and may show enhanced photoluminescent properties.

BRIEF DESCRIPTION OF THE DRAWINGS

These and/or other aspects will become apparent and more readily appreciated from the following description of the embodiments, taken in conjunction with the accompanying drawings, in which.

DETAILED DESCRIPTION

Figure 1:
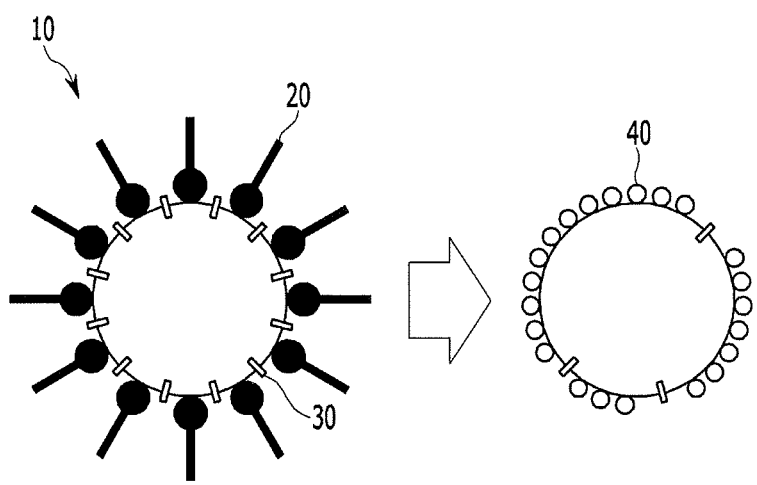
FIG. 1 is a schematic illustration of an indium-based quantum dot according to a non-limiting embodiment.

This disclosure will be described more fully hereinafter in the following detailed description, in which some but not all embodiments of this disclosure are described. This disclosure may be embodied in many different forms and is not be construed as limited to the embodiments set forth herein; rather, these embodiments are provided so that this disclosure will fully convey the scope of the invention to to those skilled in the art. Thus, in some exemplary embodiments, well-known technologies are not specifically explained. Unless otherwise defined, all terms used in the specification (including technical and scientific terms) may be used with meanings commonly understood by a person having ordinary knowledge in the art. Further, unless explicitly defined to the contrary, the terms defined in a generally-used dictionary are not ideally or excessively interpreted. In addition, unless explicitly described to the contrary, the word "comprise" and variations such as "comprises" or "comprising" will be understood to imply the inclusion of stated elements but not the exclusion of any other elements.

Unless specifically described to the contrary, a singular form includes a plural form.

As used herein, the term "and/or" includes any and all combinations of one or more of the associated listed items. Expressions such as "at least one of," when preceding a list of elements, modify the entire list of elements and do not modify the individual elements of the list.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular to embodiments only and is not intended to be limiting. As used herein, the singular forms "a," "an," and "the" are intended to include the plural forms as well, including "at least one," unless the context clearly indicates otherwise. "At least one" is not to be construed as limiting "a" or "an." Unless specified otherwise, the term "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In the drawings, the thickness of layers, films, panels, regions, etc., are exaggerated for clarity. Similar reference numerals designate similar elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more to standard deviations.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"Alkyl" as used herein means a straight or branched chain, saturated, monovalent hydrocarbon group (e.g., methyl or hexyl).

"Aliphatic" means a saturated or unsaturated linear or branched hydrocarbon group. An aliphatic group may be an alkyl, alkenyl, or alkynyl group, for example.

"Aromatic" means an organic compound or group including at least one unsaturated cyclic group having delocalized pi electrons. The term encompasses both hydrocarbon aromatic compounds and heteroaromatic compounds.

In an embodiment, an indium-based quantum dot includes a compound represented by Chemical Formula 1:

$$In_{1-x}M_xA \qquad \text{Chemical Formula 1}$$

wherein, in Chemical Formula 1, M is aluminum (Al), gallium (Ga), yttrium (Y), or scandium (Sc), A is nitrogen (N), phosphorous (P), arsenic (As), antimony (Sb), bismuth (Bi), or a combination thereof, and X is greater than or equal to 0 and less than 1.

In Chemical Formula 1, A may be phosphorous (P).

In Chemical Formula 1, A may be arsenic (As) or antimony (Sb).

The indium-based quantum dots may include a binary compound selected from InN, InP, InAs, InSb, and a combination thereof; a ternary compound selected from InGaN, InGaP, InGaAs, InGaSb, InNP, InNAs, InNSb, InPAs, InPSb, and a combination thereof; or a quaternary compound selected from GaInNP, GaInNAs, GaInNSb, GaInPAs, GaInPSb, InAlNP, InAlNAs, InAlNSb, InAlPAs, InAlPSb, and a combination thereof.

Quantum dots may be applied in the field of various opto-electronic devices, but currently most quantum dots showing comparable properties include poisonous heavy metals such as cadmium, lead, mercury, and the like, and thus pose serious environmental problems. For example, most of the colloidal quantum dot (CQD) solid films have been limited to PbS or PbSe having a rock-salt structure because of their high energy degeneracy in band edges, large exciton Bohr radius, and small band gaps for absorbing visible and near infrared (NIR) light. Particularly, they can have clean band gaps without in-gap-states regardless of the presence of various structural imperfections on the surface due to their ionic nature. As a result, Pb chalcogenide CQD solid films have shown good electronic quality compatible with existing conventional devices. However, in spite of superior optoelectronic to properties, the application of such materials to actual devices is limited or prohibited due to their high toxicity on health and the environment. This issue is particularly relevant for Cd-based CQDs, as well as Pb, which are restricted by European Union's Restriction of Hazardous Substances Directive (RoHS). Although Cd-based CQDs have been partially adopted for a backlight unit in liquid crystal displays due to their efficient and narrow band emission characteristics, prolongation and expansion of product applications are very controversial in related business circles.

As an alternative to the quantum dots including poisonous heavy metal compounds such as CdS, CdSe, CdTe, PbS, PbSe, PbTe, HgS, HgSe, and HgTe, Group 3 and Group 4 CQDs, like InP or InAs or InSb, have been considered due to their relatively low toxicity as well as visible light emission and wide-range light absorption. However, these compounds are easily oxidized and have small electronic tolerance for surface defects due to their high covalent nature, and their synthesis methods to maximize the quality have not been well developed so far. In short, Group 3 and Group 4 CQDs are intrinsically difficult to handle and to improve to acceptable quality levels.

In this regard, an attempt has been made to improve the quantum yield of the InP quantum dots using hydrofluoric acid (HF) (see J. Chem Phys. 123, 084706 (2005), the entire content of which is incorporated herein by reference). In this attempt, the InP quantum dots coordinated by certain organic ligands (that is, trioctyl phosphine (TOP) and trioctylphosphine oxide (TOPO)) are treated with the hydrofluoric acid to etch a P-dangling bond on a surface thereof. In this etching process, when a light is irradiated toward the InP quantum dot coordinated with TOP and TOPO to generate excited electrons and excited holes, the excited holes to activate the P-dangling bond, the activated P-dangling bond reacts with the fluoride (F—) in the solvent to be converted to $PF_3$, and is thereby removed from the surface of the InP quantum dots. The remaining site, rich in indium, may be passivated by the TOPO being present in excess in the etching system. The excited electrons may react with acceptors from a solution, such as dissolved oxygen, to balance charges. The InP nanocrystals prepared by the fluoric acid etching may show photoluminescence wavelength shifting toward a short wavelength in comparison with (e.g., blue-shifting with respect to) the quantum dot prior to the etching. According to the disclosed mechanism regarding the HF etching, the quantum dots to be etched with the hydrofluoric acid should include phosphorous (P), and thus such a HF etching process cannot applied to the indium-based quantum dot without including phosphorous.

In contrast, the indium-based quantum dots according to the embodiments are passivated by fluorine to include fluorine and oxygen, both of which are bonded to a surface of the quantum dot. Therefore, in the indium-based quantum dot according to the embodiments, the amount of the fluorine is greater than or equal to about 10 at. %, for example, greater than or equal to about 20 at. %, greater than or equal to about 30 at. %, or greater than or equal to about 40 at. %, based on the total number of indium atoms included in the quantum dot, as determined by Rutherford backscattering analysis. In the indium-based quantum dot according to the embodiments, the amount of the oxygen is less than or equal to about 50 at. %, for example, less than or equal to about 45 at. %, based on the total number of indium atoms included in the quantum dot, as determined by Rutherford backscattering analysis. In the indium-based quantum dot according to the embodiments, the amount of the oxygen may be about 5 at. % to about 50 at. %, for example, about 30 at. % to about 50 at. %. The quantum dot may have a ratio of indium atoms to A atoms (In/A) of greater than or equal to about 1.2, for example, a ratio of greater than or equal to about 1.3, as determined by Rutherford backscattering analysis.

Referring to FIG. 1, unlike the conventional etching with the hydrofluoric acid, in the indium-based quantum dot 10 according to the embodiments, the fluorine 40 originating from the HF may passivate a surface defect 30 (e.g., an indium dangling bond) on the indium-based quantum dot 10. Without wishing to be bound by any theory, referring to FIG. 1, it is believed that after at least a portion of the organic ligand 20 on the surface of the indium-based quantum dot 10 is removed, a reaction of the hydrofluoric acid with the surface of the indium-based quantum dot 10 may passivate the quantum dot surface with the fluorine 40 as a small-sized inorganic ligand so that the surface imperfection may be effectively eliminated. Furthermore, according to the method that will be explained in detail below, the aforementioned passivation by the fluorine 40 may be conducted without using illumination of light and may be carried out with a small activation energy of about 30 millielectron-volts (meV) to about 32 meV, such as via heating at a temperature of at least about 30° C., or at a temperature of about 80° C. to about 100° C. or higher.

In addition, the aforementioned fluorine passivation does not require the presence of excess ligands such as TOPO and TOP in the treating system.

Therefore, in some embodiments, the indium-based quantum dot having the fluorine passivation does not include a trialkyl phosphine having at least 24 carbon atoms (e.g., TOP) or a trialkyl phosphine oxide having at least 24 carbon atoms (e.g., TOPO).

In some embodiments, the indium-based quantum dot may include a water-miscible organic solvent that is bound to a surface thereof. The water-miscible organic solvent may include dimethyl sulfoxide (DMSO), dimethyl formamide (DMF), formamide (FA), methyl formamide (MFA), dimethyl acetamide (DMAc), diethylene triamine (DETA), or a combination thereof. The indium-based quantum dot may be dispersed in water or in a water miscible organic solvent without any substantial agglomeration. In this case, the quantum dot does not include a hydrophobic ligand that is coordinated with a surface thereof, where the hydrophobic ligand includes a trialkylphosphine having at least 24 carbon atoms, a trialkylphosphine oxide having at least 24 carbon atoms, a fatty acid having a C8 or higher aliphatic hydrocarbon group, a thiol compound having a C8 or higher hydrocarbon group, an amine having a C8 or higher hydrocarbon group, and a phosphorous acid having a C8 or higher, or a combination thereof. Examples of the hydrophobic ligand may include, but are not limited to, octane thiol, dodecane thiol, hexadecane thiol, octadecane thiol, benzyl thiol; octyl amine, dodecyl amine, hexadecyl amine, octadecyl amine, dimethyl amine, diethyl amine, dipropyl amine; octanoic acid, dodecanoic acid, hexadecanoic acid, octadecanoic acid, oleic acid, benzoic acid; a phosphine compound such as trioctylphosphine or a phosphine oxide compound thereof, or a combination thereof.

In some embodiments, the indium-based quantum dot does not have a shell disposed on the surface thereof, and the shell includes a semiconductor nanocrystal, and the semiconductor nanocrystal of the shell having a bandgap energy of greater than the compound represented by Chemical Formula 1. Therefore, the quantum dot may include indium on a surface thereof, and an amount of the indium on the surface may be greater than or equal to about 10%, for example, greater than or equal to about 15%, or greater than or equal to about 20%, based on a total amount of the indium in the quantum dot.

Passivation of surface defects may be an important consideration for controlling the properties of the CQDs and applying them to various optoelectronic devices. Shell coating may be one of the best strategies to passivate surface defects on CQDs for the applications to light emitting devices, such as light-emitting diodes (LEDs), solar concentrators, lasers, and biomarkers.

For example, on an indium based quantum dot core, a semiconductor nanocrystal shell (e.g., ZnS shell) having a greater band gap energy than the indium based quantum dot core may be disposed on a surface to increase the quantum efficiency of the indium based quantum dots. However, since the wide-band gap semiconductor shells may prevent the carrier transport, the surface defects may have to be controlled by other means such as short-chain molecular ligands or atomic ligands for the applications utilizing charge transport in CQD-based solution-processed devices such as solar cells, photodetectors, and printable field-effect transistors (FETs). This is because the semiconductor shell may confine the electron/hole pairs within the interior of the core semiconductor nanocrystal. For example, the core-shell type quantum dots may not be suitable or may even be disadvantageous for some application fields that require the transport of electrons and/or holes between the quantum dots, such as a photodetector, a light absorbing layer of an image sensor or a IR sensor, a solar cell, a channel material for a field effect transistor (FET), a flash memory, and the like. Therefore, a technology capable of enhancing the luminous properties of the indium-based quantum dots to without using the semiconductor shell would be advantageous, and the indium-based quantum dot according to the aforementioned embodiments may find their utility in the foregoing application fields because they may show enhanced light emitting properties without the semiconductor nanocrystal shell.

The indium-based quantum dot according to the aforementioned embodiments may have a quantum yield of greater than or equal to about 10%. The indium-based quantum dot may have a light emission spectra with a full width at half maximum (FWHM) of less than or equal to about 80 nm, for example, less than or equal to about 55 nm. The indium-based quantum dot may have a photoluminescence peak wavelength that is longer than a photoluminescence peak wavelength of the indium-based quantum dot prior to the introduction of the fluorine bonded to the surface. In other words, the indium-based quantum dot may show a red-shifted photoluminescence (PL) peak wavelength in comparison with the original peak wavelength of the indium-based quantum dot prior to treatment with the fluorine. Therefore, for example, the photoluminescence peak wavelength of the quantum dot may be greater than or equal to about 800 nm.

The indium-based quantum dot may have an average particle diameter (e.g. the greatest dimension in case of non-spherical particles) of about 1.5 nm to about 10 nm, for example, from about 2 nm to about 4 nm. The shape of the quantum dot is not particularly limited. By way of an example, the indium-based quantum dot may have a spherical shape, a pyramidal shape, a multi-arm shape, or a cubic shape. The indium-based quantum dot may be in the form of a nanosphere, a nanotube, a nanowire, a nano-fiber, a nano-plate, or the like.

Methods of manufacturing the aforementioned indium-based quantum dot are explained below.

In an embodiment, a method of producing the aforementioned indium-based quantum dot includes:

providing an indium-based quantum dot including a compound represented by Chemical Formula 1;

washing the indium-based quantum dot with a non-solvent;

dispersing the washed indium-based quantum dot in a mixed solvent including a non-polar solvent and a polar solvent to prepare a quantum dot dispersion;

providing a HF-containing solution; and injecting the HF-containing solution into the quantum dot dispersion to prepare a mixture of the quantum dot dispersion and the HF-containing solution and heating the mixture of the quantum dot dispersion and the HF-containing solution or irradiating the same with a light source.

The indium-based quantum dot including a compound represented by Chemical Formula 1 may be prepared using any suitable method, and is commercially available. For example, the indium-based quantum dots may be prepared by reacting an indium-containing precursor and a Group 5 element containing precursor in a synthesis solvent in the presence of an organic ligand compound.

Examples of the indium-containing precursor may include, but are not limited to, an indium powder, an alkylated indium compound, an indium alkoxide, an indium carboxylate, an indium nitrate, an indium perchlorate, an indium sulfate, an indium acetylacetonate, an indium halide, an indium cyanide, an indium hydroxide, an indium oxide, an indium peroxide, and a combination thereof. For example, the indium-containing precursor may include trimethyl indium, an indium carboxylate such as indium myristate, indium acetate, indium hydroxide, indium chloride, indium oxide, indium nitrate, indium sulfate, or a combination thereof, but it is not limited thereto.

The Group 5 element-containing precursor may be appropriately selected in light of the desired quantum dot composition, the type of the indium-containing precursor, and the like. For example, the Group 5 element-containing precursor may include tris(trimethylsilyl)phosphine, tris(trimethylgermyl) phosphine, tris(dimethylamino)phosphine, triethylphosphine, tributylphosphine, trioctylphosphine, triphenylphosphine, tricyclohexylphosphine, tris(trimethylsilyl) arsine, tris(trimethylgermyl) arsine, tris(dimethylamino) arsine, triethylarsine, tributyl arsine, trioctyl arsine, triphenyl arsine, tricyclohexyl arsine, arsenic oxide, arsenic chloride, arsenic sulfate, arsenic bromide, arsenic iodide, and a combination thereof, and the like, but it is not limited thereto.

Types of the organic ligand compound are not particularly limited and may be selected appropriately. For example, the organic ligand compound may include, but is not limited to, RCOOH, $RNH_2$, $R_2NH$, $R_3N$, RSH, $R_3PO$, $R_3P$, ROH, RCOOR', $RPO(OH)_2$, $R_2POOH$ (wherein R and R' are independently a C1 to C24 aliphatic hydrocarbon, or a C5 to C20 aromatic hydrocarbon), or a combination thereof.

The solvent may be selected from a C6 to C22 primary amine such as hexadecyl amine; a C6 to C22 secondary amine such as dioctyl amine; a C6 to C40 tertiary amine such as trioctyl amine; a heterocyclic compound having a nitrogen atom such as pyridine; a C6 to C40 aliphatic hydrocarbon (e.g., an alkane, an alkene, or an alkyne) such as hexadecane, octadecane, octadecene, squalane, and the like; a C6 to C30 aromatic hydrocarbon such as phenyl dodecane, phenyl tetradecane, phenyl hexadecane, and the like; a phosphine substituted with a C6 to C22 alkyl group such as trioctyl phosphine; a phosphine oxide substituted with a C6 to C22 alkyl group such as trioctyl phosphine oxide; a C12 to C22 aromatic ether such as phenyl ether, benzyl ether, and the like; and a combination thereof.

The reaction temperature and the reaction time for preparation of the indium-based quantum dot are not particularly limited and may be selected appropriately. For example, the reaction temperature may be greater than or equal to about 200° C., for example, greater than or equal to about 250° C., but it is not limited thereto. The reaction time may be greater than or equal to about 10 minutes (min), for example, greater than or equal to about 15 min, but it is not limited thereto. The amounts of the indium-containing precursor, the Group 5 element-containing precursor, the organic ligand compound, and the solvent may be adjusted by the person of skill in the art without undue experimentation, and are not particularly limited.

The prepared indium-based quantum dot is washed with a non-solvent. The non-solvent may include acetone, ethanol, methanol, isopropyl alcohol, acetonitrile, or a combination thereof.

The washed indium-based quantum dot is then dispersed in a mixed solvent including a non-polar solvent and a polar solvent to obtain a quantum dot dispersion. The polar solvent may include propanol, butanol, or a combination thereof. The non-polar solvent may include toluene, hexane, cyclohexane, chloroform, or a combination thereof. In the mixed solvent, the volume ratio between the polar solvent and the non-polar solvent is not particularly limited and may be selected appropriately. For example, the mixed solvent may include about 0.1 milliliters (mL) to about 10 mL of the polar solvent per 1 mL of the non-polar solvent, but is not limited thereto.

An HF-containing solution is added to the quantum dot dispersion, and the resulting mixture is either heated at a temperature of greater than or equal to about 30° C. (e.g., at a temperature of at least about 80° C.) or irradiated using active energy ray having a wavelength of less than or equal to about 1500 nm (e.g., of about 1100 nm or less or of about 900 nm or less, or of about 900 nm to 1100 nm, or of 250 nm to 1100 nm). The heating or the irradiation may be carried out in the presence of oxygen or under an inert gas atmosphere (e.g., a nitrogen atmosphere).

The HF-containing solution is prepared by dissolving the HF in an organic solvent, which may include a C1 to C5 alcohol, acetone, chloroform, tetrahydrofuran, acetonitrile, or a combination thereof, and the like. In some embodiments, the HF-containing solution does not include water. In the HF-containing solution, the concentration of the HF is not particularly limited but may be appropriately adjusted by the person of skill in the art without undue experimentation. The amount of the HF-containing solution injected into the quantum dot dispersion may be controlled so that in the HF-containing solution, the number of fluorine molecules may be 10 times to 10,000 times greater than the number of the indium-based quantum dots, for example, less than or equal to about 5,000 times greater than, less than or equal to about 2,000 times greater than, or less than or equal to about 1,500 times greater than the number of the indium-based quantum dots. Within the aforementioned range of the fluorine concentration, fluorine passivation may effectively occur to result in enhanced PL intensity. The time of the heating or the irradiation is not particularly limited and may be appropriately adjusted by the person of skill in the art without undue experimentation. For example, the heating or the irradiation may be carried out for at least 3 min, for example, at least 10 min, at least 20 min, or at least 25 min, but is not limited thereto.

In another embodiment, a method of producing the aforementioned indium-based quantum dot includes:
providing an indium-based quantum dot including a compound represented by Chemical Formula 1;
washing the indium-based quantum dot with a non-solvent;
dispersing the washed indium-based quantum dot in a first organic solvent that is water immiscible to obtain a first quantum dot dispersion;
dissolving HF in a second organic solvent that is water miscible to obtain an HF solution;
contacting the first quantum dot dispersion with the HF solution (for example, to prepare a mixture of the first quantum dot dispersion and the HF solution), and transferring the indium-based quantum dots from the first quantum dot dispersion to the HF solution, to provide a second quantum dot dispersion including the indium-based quantum dots in the second organic solvent.

The indium-based quantum dots in the second quantum dot dispersion may include the fluorine passivated indium-based quantum dots as set forth above. The method may further include heating the mixture of the first quantum dot dispersion and the HF solution or irradiating the same with the active energy ray.

In this embodiment, the providing of the indium-based quantum dots, the to washing with the non-solvent, and the heating or irradiation thereof, are the same as explained above.

The first organic solvent for dispersing the washed indium-based quantum dots may include hexane, cyclohexane, or a combination thereof. The second organic solvent for the preparation of the HF solution may include dimethyl sulfoxide (DMSO), dimethyl formamide (DMF), formamide (FA), methyl formamide (MFA), dimethyl acetamide (DMAc), diethylene triamine (DETA), or a combination thereof. In the HF solution, the number of fluorine molecules may be 1000 times to 1,000,000 times greater than the number of the indium-based quantum dots.

The first quantum dot dispersion and the HF solution are not miscible with each other, and when they are mixed and the resulting mixture is left alone, the indium-based quantum dots dispersed in the first quantum dot dispersion come into contact and react with the HF and are thereby transferred to the HF solution (e.g. a phase transition occurs) to produce a second quantum dot dispersion wherein the HF treated quantum dots are dispersed in the second organic solvent. For the phase transfer of the quantum dots, the mixture of the first quantum dot dispersion and the HF solution may be subject to a mild heating or light irradiation process. Details of the heating and the irradiation are the same as set forth above.

In this embodiment, almost all of the hydrophobic organic ligands existing on the surface of the indium-based quantum dot may be removed during the phase transition without any additional surface treatment. The indium-based quantum dot treated with the HF solution may show the peaks corresponding to indium oxides (e.g., $InO_x$, $InPO_x$), and indium fluoride ($InF_3$) in its Raman spectrum. The indium-based quantum dots prepared in this embodiment may be dispersed in the second organic solvent and/or the water.

Another embodiment provides a device including the aforementioned indium-based quantum dot.

The device may be a solar cell, a photo-detector, a field effect transistor, a flash memory, or a photoelectric chemical device. The foregoing indium-based quantum dot may be applied to a light absorbing layer of a solar cell or a photodetector to absorb the visible or near infrared range of light and thereby produce electronic energy and a signal. In addition, the quantum dots may be applied to an n-type or p-type channel layer of a transistor and may be used in a floating gate in a flash memory. In addition, the foregoing indium-based quantum dot may be used in a photo-electronic converting layer in a photoelectric cell, which receives light to dissociate water, thereby producing hydrogen and oxygen, or to convert carbon dioxide to produce an organic compound.

Hereinafter, the embodiments are illustrated in more detail with reference to specific examples. However, they are exemplary embodiments and the scope of the present disclosure is not limited thereto.

EXAMPLES

Measurement

[1] Quantum dot photoluminescence analysis

A photoluminescence (PL) spectrum of a quantum dot is obtained using a Horiba Jobin Yvon Triax 320 Fluorolog at an irradiation wavelength of 450 nm.

[2] Ultraviolet (UV) spectroscopy analysis

A UV spectroscopy analysis is carried out using a Shimadzu UV-3600 UV spectrometer to obtain a UV-visible absorption spectrum.

[3] FT-IR spectroscopy analysis

Infra-Red spectroscopy analysis is conducted using a Perkin-Elmer FT-IR spectrometer.

[4] Nuclear Magnetic Resonance (NMR) spectroscopy analysis

A NMR spectroscopy analysis is conducted using a Bruker 400 megahertz (MHz) NMR spectrometer.

[5] Raman spectroscopy analysis

A Raman spectroscopy analysis is conducted using a Horiba Raman spectrometer.

[6] Rutherford Backscattering Spectroscopy (RBS) Analysis

A RBS analysis is conducted using a 3 megaelectron volt (MeV) $He^{2+}$ ion beam in an oxygen resonance mode.

[7] Inductively Coupled Plasma Atomic Emission Spectroscopy (ICP-AES) analysis

An Inductively Coupled Plasma-Atomic Emission Spectrometer (manufactured by Perkin-Elmer Co., Ltd., model name: 5300 PV) is used to conduct ICP-AES analysis.

[8] TOF-SIMS analysis

A Time-of-Flight Secondary Ion Mass Spectrometry (TOF-SIMS) analysis is conducted using a TOF-SIMS V (ION-TOF GmbH, Germany) equipped with a 25 kiloeletron volt (keV) Bi+ ion gun.

[9] XPS analysis

An X-ray photoelectron spectroscopy (XPS) elemental analysis is conducted using a Quantum 2000 from Physical Electronics under the following conditions: 0.5~15 keV, 300 watts (W), minimum analysis region: 10 micrometers, sputter rate: 0.1 nm/min Reference Example 1

Preparation of InP QD

[1] 0.2 millimole (mmol) (0.058 g) of indium acetate, 0.6 mmol (0.15 g) of palmitic acid, and 10 mL of 1-octadecene are placed in a flask, subjected to a vacuum state at 120° C. for 1 h, and then heated to 280° C. after the atmosphere in the flask is exchanged with $N_2$. Then, a mixed solution of 0.1 mmol (29 uL) tris(trimethylsilyl)phosphine ("TMS3P") and 0.5 mL of trioctylphosphine ("TOP") is quickly injected and the reaction proceeds for 20 min. The reaction mixture is then rapidly cooled and acetone is added thereto to produce a precipitate, which is then separated by centrifugation and dispersed in toluene. UV first absorption maximum of the InP quantum dot thus prepared is 480~650 nm.

[2] A UV spectroscopy analysis, an ICP-AES analysis, and a spherical nanoparticle model confirm that the prepared InP quantum dot has the following composition: (see Table 1)

Diameter: 3.6 nm
A total atom number: 951
Indium atom number: 555
P atom number: 396
Indium atom number at the surface: 159 (29% based on the total number of the indium atoms)
Unpassivated charge number: 477

Figure 2A:
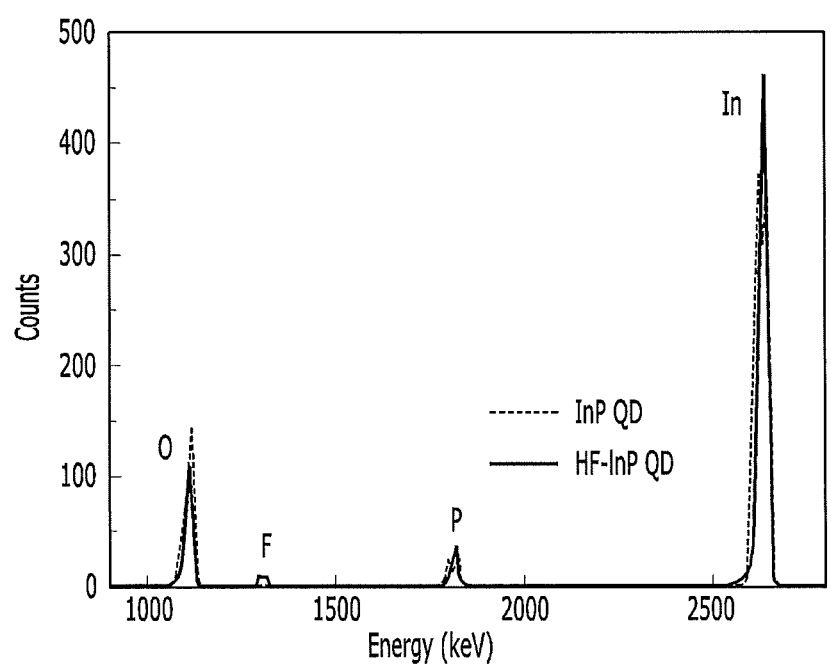
FIG. 2A is a graph of counts versus energy (kiloelectron volts, keV) showing the results of Rutherford backscattering spectroscopy for the quantum dots prepared in Reference Example 1 and Example 1-1.
Figure 2B:
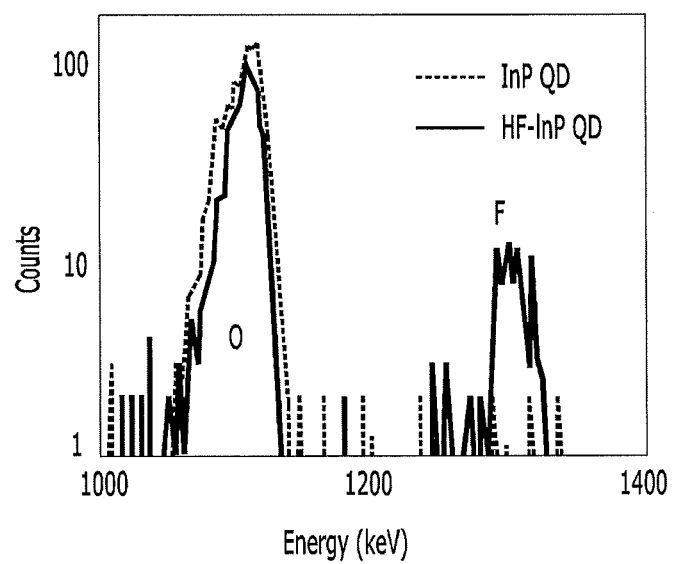
FIG. 2B is an expanded portion of the graph in FIG. 2A.

[3] An RBS analysis is conducted for the prepared quantum dot and the results are shown in FIGS. 2A and 2B and in Table 2.

Reference Example 2

Preparation of InAs QD 16 mmol (3.536 g) of indium chloride and 27 mmol (10 g) of TOP are placed in a flask, and heated to 120° C. under vacuum for 20 minutes. Then, the atmosphere in the flask is exchanged with $N_2$, and the mixture is heated again to a temperature of 260° C. for 10 min to produce an $InCl_3$-TOP mixture. Then, 3 mmol (2.3 ml) of the $InCl_3$-TOP mixture and 2 mmol (0.6 g) of tris(trimethylsilyl)arsine ("$TMS_3As$") are mixed in a glove box, and the reaction proceeds for 20 min at room temperature to prepare a stock solution. 5.4 mmol (2 g) of TOP is put into a flask and is heated to 120° C. for 20 minutes. Then, the atmosphere in the flask is exchanged with $N_2$. Again, it is heated at a temperature of 300° C. for 10 min, and then 1 mL of the stock solution is injected thereto, and a reaction proceeds at 260° C.

After 30 min, the reaction mixture is rapidly cooled to room temperature and acetone is added thereto to produce a precipitate, which is then separated by centrifugation and dispersed in toluene. The average diameter of the prepared quantum dots is 2.8 nm. UV first absorption maximum of the InAs quantum dot thus prepared is 700-2500 nm.

Reference Example 3

TMSP-InP QD Having a Phosphorous (P) Rich Surface $4.55 \times 10^{-5}$ mmol of the quantum dots prepared in Reference Example 1 are placed in a flask including 20 mL of 1-octadecene and then heated at a temperature to of 120° C. under vacuum. After 1 h, the atmosphere of the flask is replaced with nitrogen. After heating the flask at 280 °C., a mixed solution of 0.46 mmol (130 uL) of tris(trimethylsilyl) phosphine ("TMS3P") and 2 mL of trioctylphosphine ("TOP") is quickly injected and the reaction proceeds for 20 min to prepare an InP quantum dot having a phosphorous (P) rich surface (hereinafter, TMSP-InP QD). The TMSP-InP QD has an average diameter of 4.0 nm. UV first absorption maximum of the TMSP-InP quantum dot thus prepared is 530-650 nm.

Reference Example 4

Preparation of InP/ZnS Core-Shell Quantum Dots

Using the InP QDs prepared in Reference Example 1, InP/ZnS Core-shell quantum dots are prepared according to the following procedure:

1.2 mmoL (0.224 g) of zinc acetate, 2.4 mmol (0.757 g) of oleic acid, and 10 mL of trioctylamine are placed in a flask, subjected to a vacuum state at 120° C. for 10 minutes, and then heated to 280° C. after the atmosphere in the flask is exchanged with N2. A toluene dispersion of the InP semiconductor nanocrystal prepared in Reference Example 1 (OD=optical density of 1st exciton absorption, OD:0.15, or 1 ml of a 1 wt % toluene solution) is added thereto within 10 seconds, and then 2.4 mmol of S/TOP is added thereto and the reaction proceeds for 120 minutes. After that, the reaction mixture is rapidly cooled to room temperature and acetone is added thereto to produce nanocrystal particles, which are then separated by centrifugation and dispersed again in toluene.

Example 1-1

Fluorine Passivation of the InP QD (by Heating at 80° C.)

Figure 3:
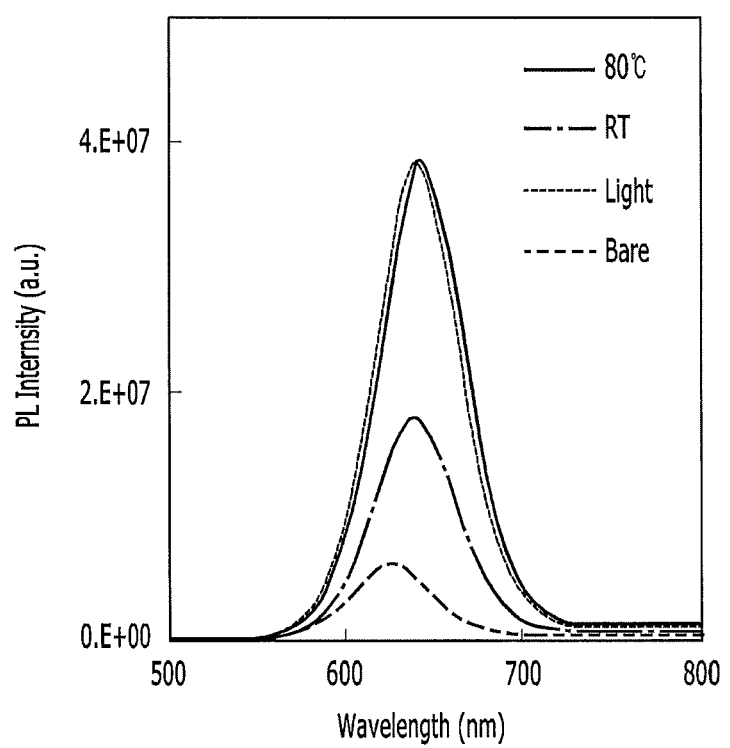
FIG. 3 is a graph of photoluminescence (PL) intensity (arbitrary units, a.u.) versus wavelength (nm) which shows a photoluminescent spectrum of the quantum dots prepared in Examples 1-1 to 1-3.

[1] Acetone is added to a toluene dispersion of the InP QDs prepared in to Reference Example 1 to precipitate the QDs again (the first time of acetone washing), and the QDs are centrifuged and then dispersed again in toluene. Hydrofluoric acid is dissolved in butanol to prepare a HF solution at a concentration of 0.35 M. 4 mL of a mixed solvent of toluene and butanol (vol/vol=1/1) is placed in a flask, to which 2 mL of the toluene dispersion of the InP QDs (optical density=0.15) is added, and dispersed. 100 uL of the HF solution is injected to the resulting QD dispersion, and the mixture of the QD dispersion and the HF solution is heated at a temperature of 80° C. for 30 min to produce the InP QDs passivated by fluorine. The PL spectrums of the obtained InP QDs are shown in FIG. 3 together with that of the InP QDs prior to being passivated by fluorine.

[2] An ICP-AES analysis is made for the InP QDs passivated by fluorine, and the results are applied to a 3.6 nm spherical quantum dot model to obtain the following data set forth in Table 1.

TABLE 1

| Samples | Number of atoms | | | | Ratio of the number of atoms |
|---|---|---|---|---|---|
| | In | P | O | F | In/P |
| Reference Example 1 (InP) | 555 | 385 | 450 | — | 1.34 ± 0.11 |
| Example 1-1 (F passivated InP) | 555 | 394 | 233 | 427 | 1.37 ± 0.10 |

The results in Table 1 confirm that the F-passivated InP QDs have a decreased number of oxygen atoms and an increased number of fluorine atoms bonded to a surface thereof, in comparison with the InP QDs of Reference Example 1.

Figure 17A:
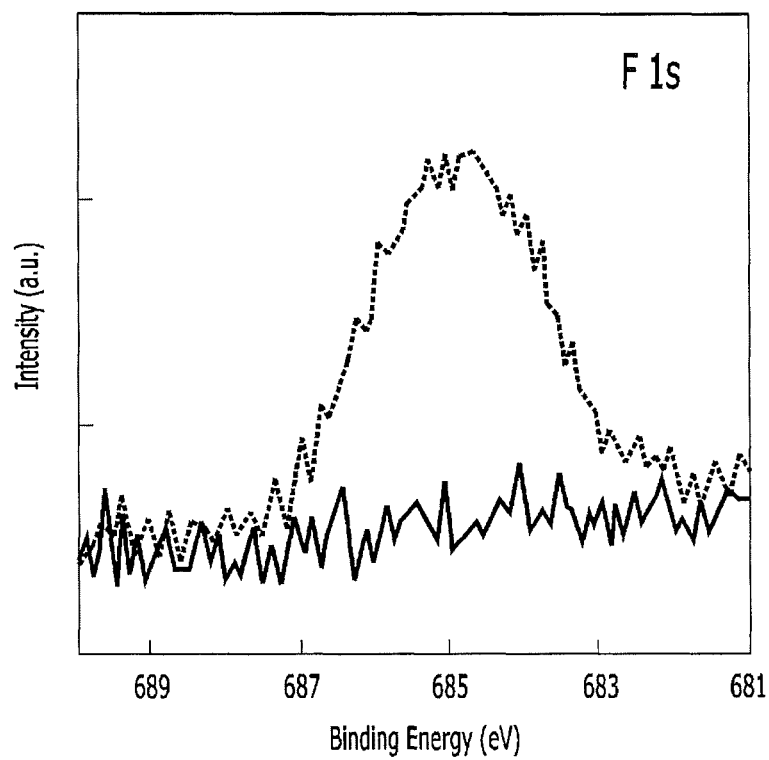
FIGS. 17A to 17D are graphs of intensity (a.u.) versus binding energy (eV) as measured by x-ray photon spectroscopy (XPS) analysis for the quantum dot prepared in Example 1-1.
Figure 17B:
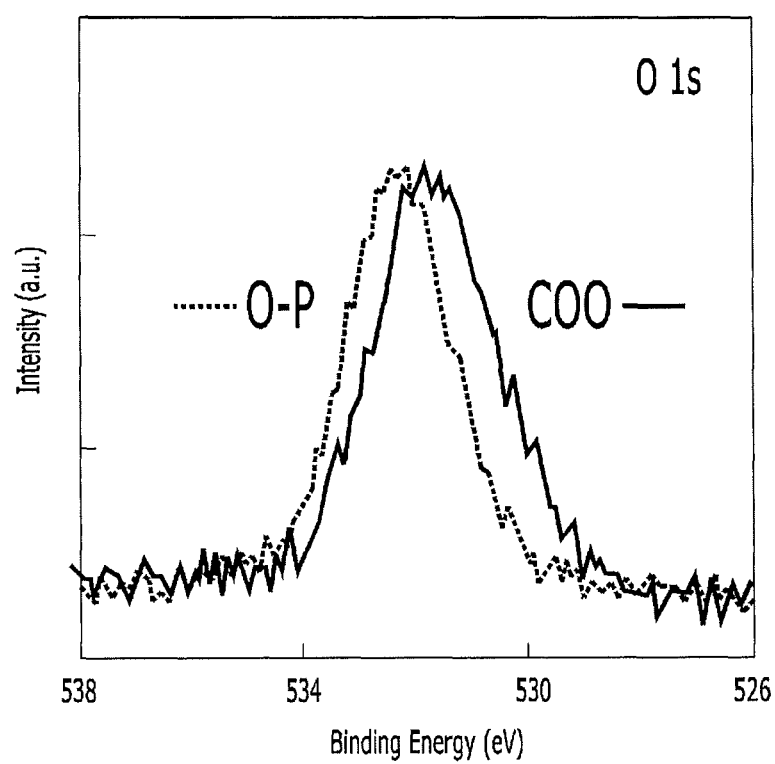
Figure 17C:
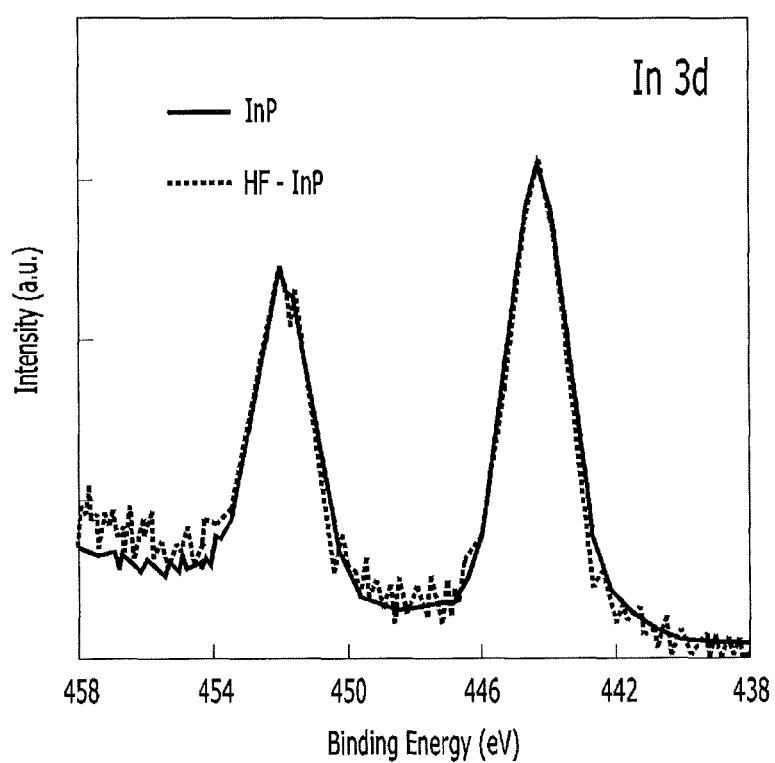
Figure 17D:
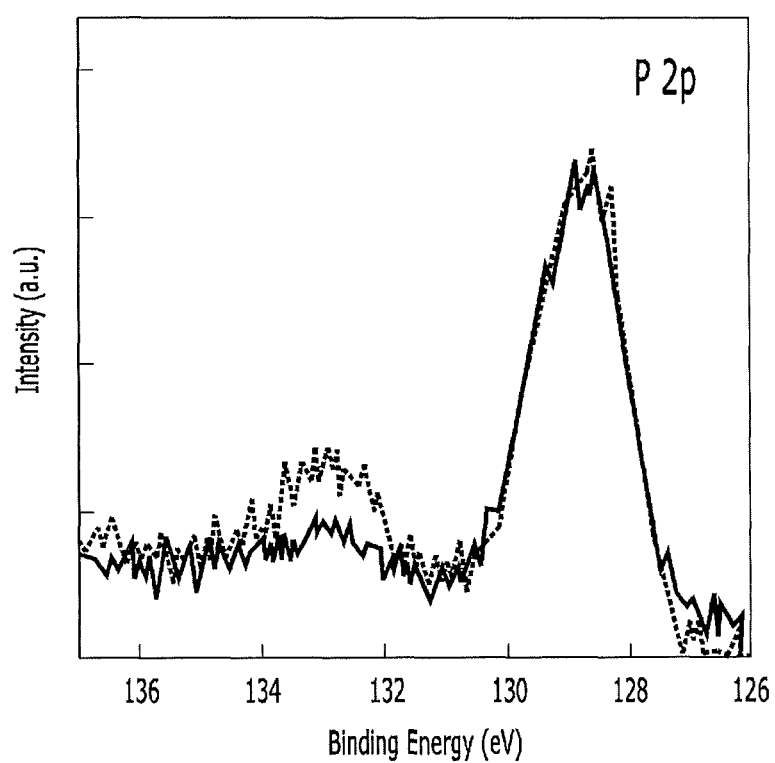
Figure 18A:
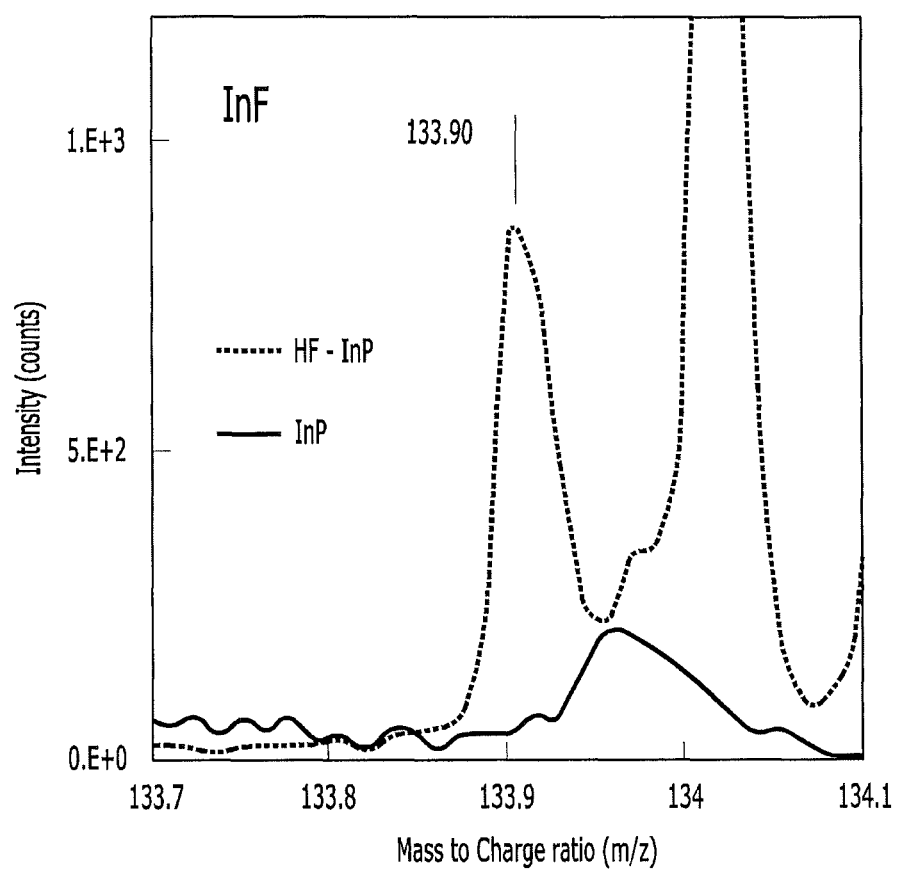
FIGS. 18A to 18F are graphs of intensity (counts) versus mass to charge ratio, which show the results of Time-of- Flight Secondary Ion Mass Spectrometry (ToF-SIMS) analysis for the quantum dot prepared in Example 1-1.
Figure 18B:
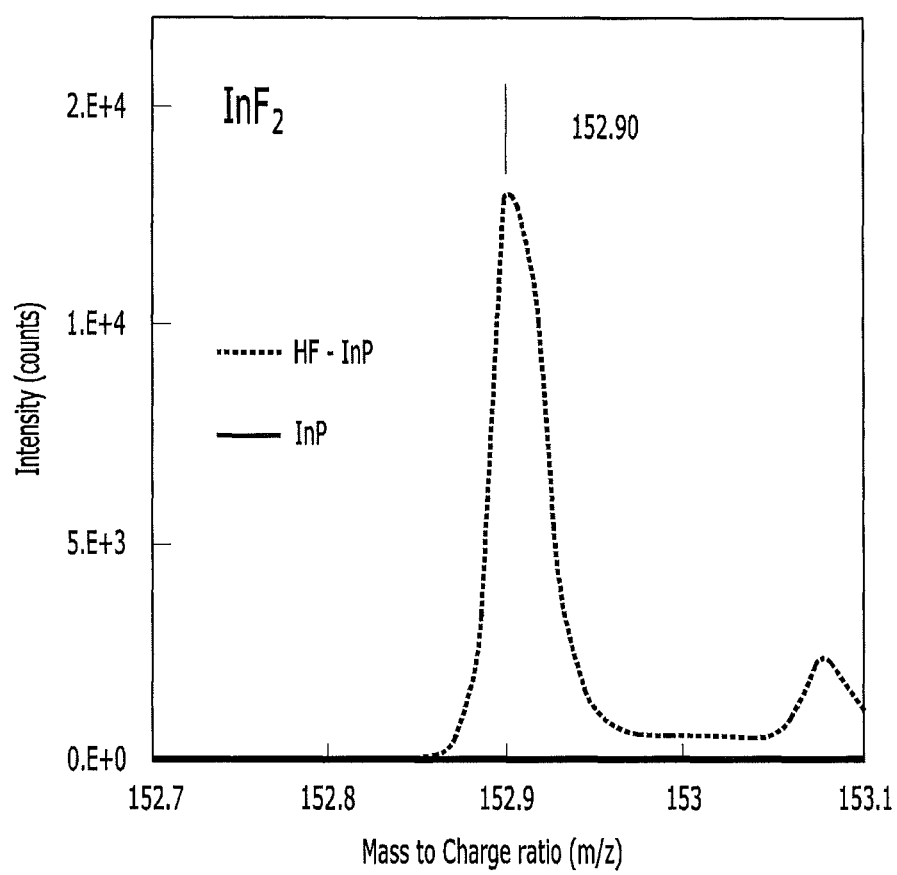
Figure 18C:
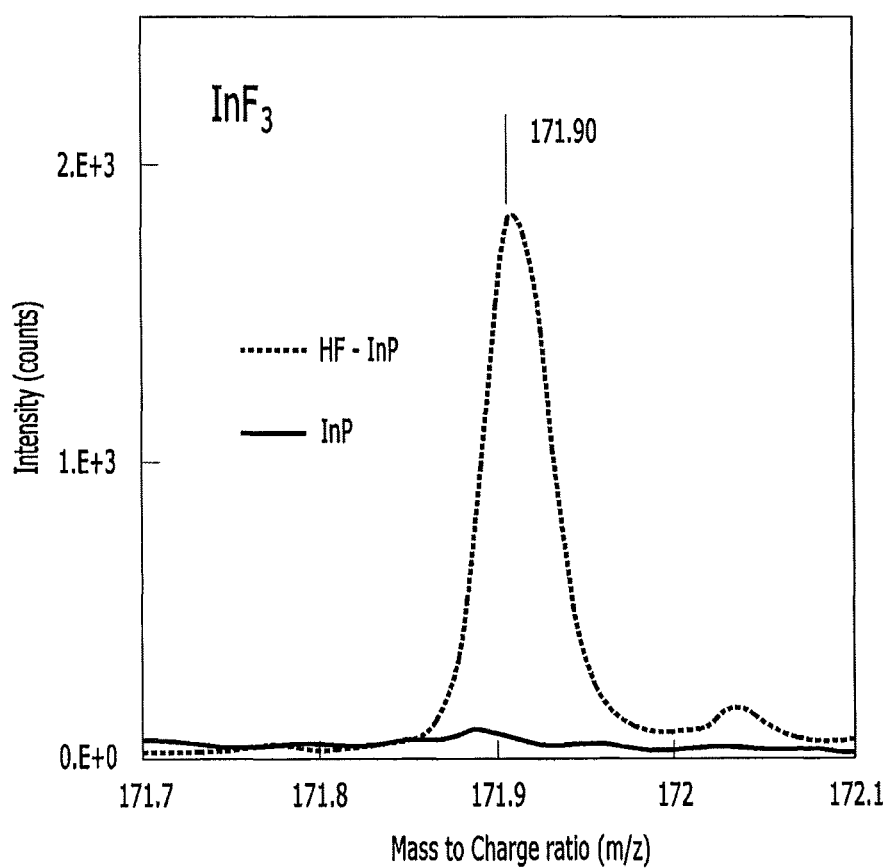
Figure 18D:
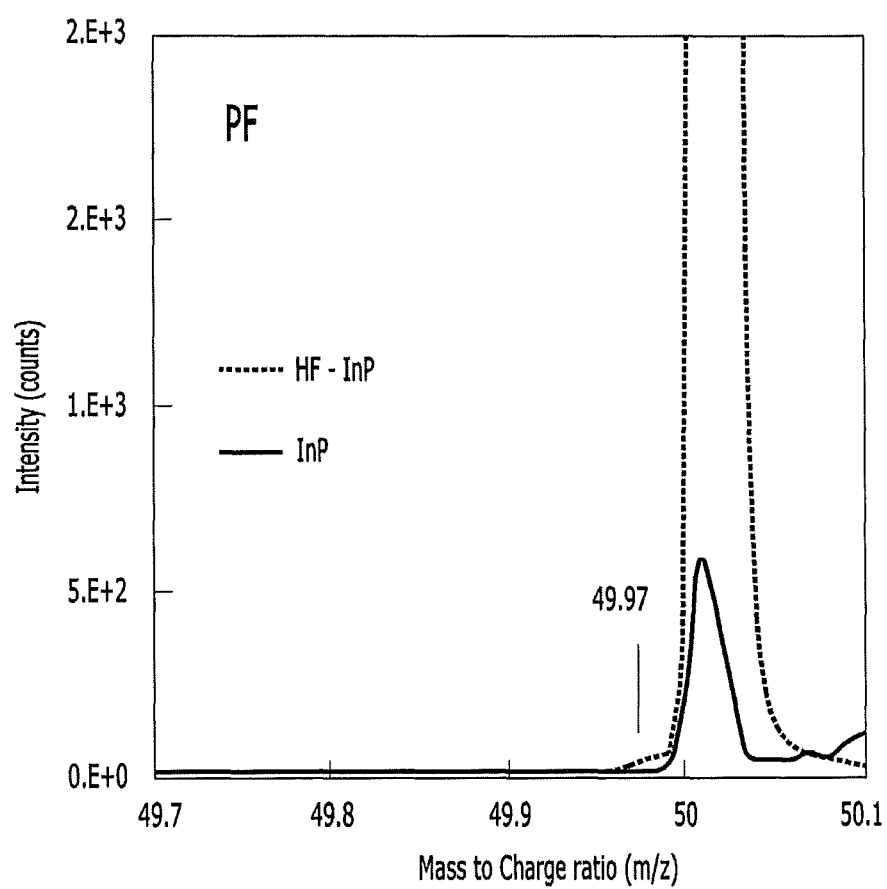
Figure 18E:
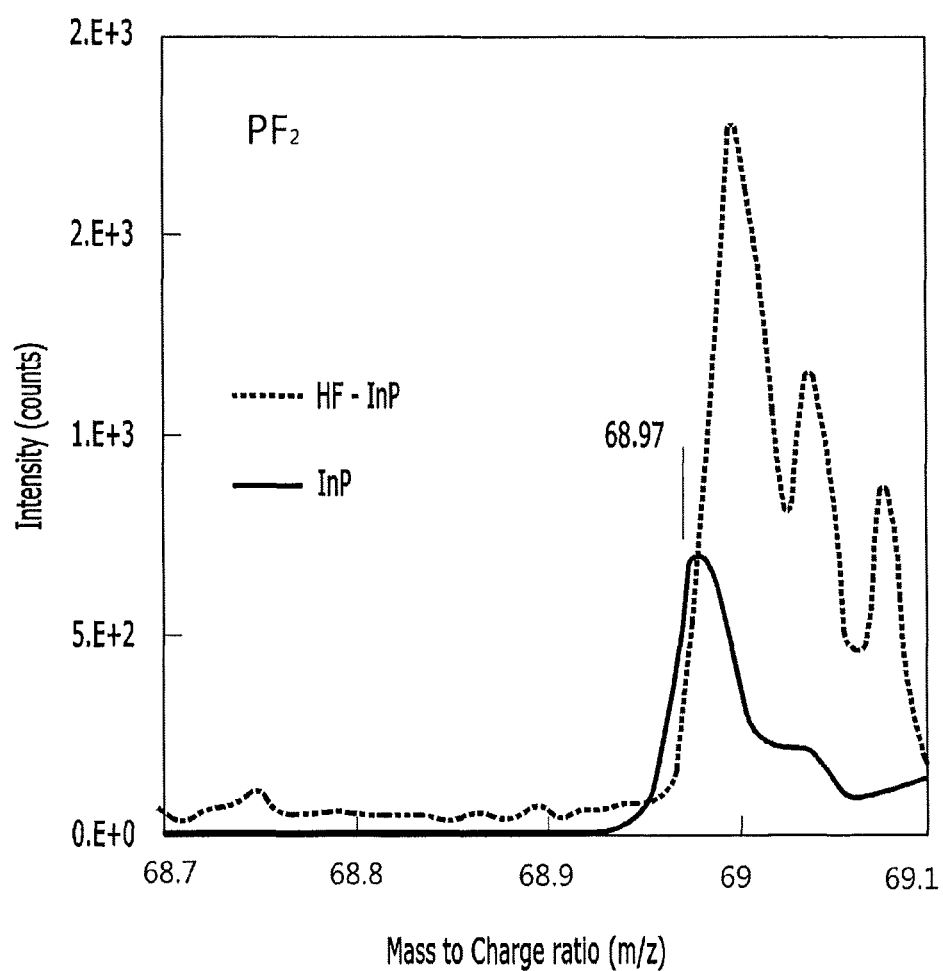
Figure 18F:
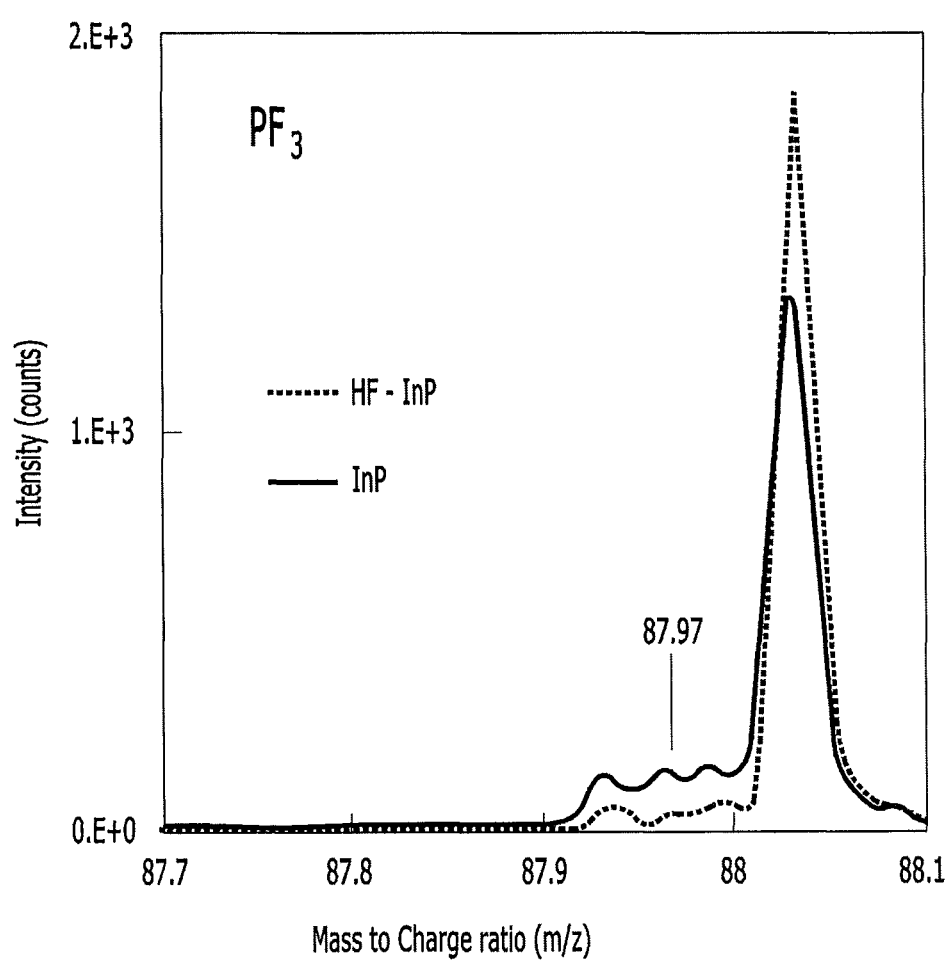

[3] To understand the surface structure of InP QDs before and after the HF reaction, an XPS analysis and ToF-SIMS analysis are conducted. The results of XPS are shown in FIG. 17A, FIG. 17B, FIG. 17C, and FIG. 17D. The results of to TOFSIMS are shown in FIGS. 18A to 18F. An F1s peak of XPS was clearly detected in the HF-treated QDs implying that F remains and/or is bound to the InP surface after the reaction (FIG. 17A). According to FIGS. 18A to 18F, ToF-SIMS peaks corresponding to InF (m/z=133.90), InF$_2$ (m/z=152.90), and InF$_3$ (m/z=171.90) found in the negative ion spectra instead of the peaks of PF (m/z=49.97), PF$_2$ (m/z=68.97), and PF$_3$ (m/z=87.97), indicate that F ions preferably react with In.

A shift of an O1s XPS peak from 532 eV to 533 eV indicates that the type of oxygen on InP QDs has been changed from carboxylates to In—O—P, or the oxidation after the ligand elimination by HF treatment. Increased intensity of the XPS P 2p peak at 133 eV corresponding to cationic phosphorus also suggests the formation of In—O—P structures. That is, the surfaces of InP QDs are covered by both F and O as a result of HF reaction.

[4] An RBS analysis is made for the InP QDs passivated by fluorine, and the results are shown in FIGS. 2A and 2B and in Table 2.

TABLE 2

| Samples | In/P | F/In | O/In |
|---|---|---|---|
| Ref. Example 1 (InP) | 1.44 | — | 0.81 |
| Example 1-1 (F passivated InP) | 1.41 | 0.77 | 0.42 |

The results of FIGS. 2A, 2B, and Table 2 confirm that in the case of the InP quantum dots of Reference Example 1, an amount of the oxygen bonded to the surface with respect to the amount of indium is 81%, while in the case of the fluorine passivated InP quantum dots of Example 1-1, an amount of the oxygen bonded to the surface with respect to the amount of indium is 42%.

The results of FIGS. 2A, 2B, and Table 2 confirm that in the case of the InP quantum dots of Reference Example 1, an amount of the fluorine bonded the surface with respect to the amount of indium is 0%, while in the case of the fluorine passivated InP quantum dots of Example 1-1, an amount of fluorine bonded to the surface with respect to the amount of indium is 77%.

When determined based on the RBS analysis, the ratio of In/P of the InP quantum dots of Reference Example 1 is similar to that of the fluorine passivated InP quantum dots of Example 1-1.

Prior to the HF reaction, the amount of 0 primarily contributed by the carboxylate ligands (effective charge of single O is −1) is 81% of the amount of In, which corresponds to 33% passivation of indium-dangling bonds on the surface. Lack of the ligands for the full passivation can explain the poor PL QY of bare InP QDs. On the other hand, F (effective charge is −1) and O (effective charge is −2) as examples of X-type ligands can passivate 120% of total indium-dangling bonds according to their amounts from RBS. The coverage of more than 100% might be due to the oxidation of intact P beneath the outermost In by forming In—O—P, or the interaction with counter cations in the solvent like proton. The increased surface coverage suggests that F and O are more effective to passivate the In dangling bonds than the organic carboxylate ligands.

Example 1-2

Fluorine Passivation of the InP QD (by Irradiation)

The fluorine passivated InP quantum dots are prepared in the same manner set forth in Example 1-1, except that the prepared HF-quantum dot mixture is irradiated with white light of 50 milliwatts per square centimeter (mW/cm$^2$) using a Xe lamp, instead of the heating of 80° C. The PL spectrums of the obtained quantum dots are shown in FIG. 3.

Example 1-3

Fluorine Passivation of the InP QD (Prepared at Room Temperature (RT))

The fluorine passivated InP quantum dots are prepared in the same manner set forth in Example 1-1, except that the obtained HF-quantum dot mixture is left alone at room temperature instead of heating at 80° C. The PL spectrums of the obtained quantum dots are shown in FIG. 3.

The results of FIG. 3 confirm that the F-passivated InP quantum dots prepared in Example 1-1 (using 80° C. heating) and Example 1-2 (using irradiation) show significantly enhanced quantum efficiency, and the F-passivated InP quantum to dots prepared in Example 1-3 (at room temperature) show lower quantum efficiency than the QDs prepared by the heating or the irradiation, but may still show far higher quantum efficiency than that of the non-treated InP QDs. Such results imply that not only irradiation but also mild heating may bring about improvement in quantum efficiency, and that a small activation energy such as about 30 meV is sufficient for the F passivation using the HF so that HF may sufficiently work for the PL improvement of the InP QDs even with the assistance of the energy as small as 30 meV corresponding to about 80° C.

Example 1-4

Figure 19A:
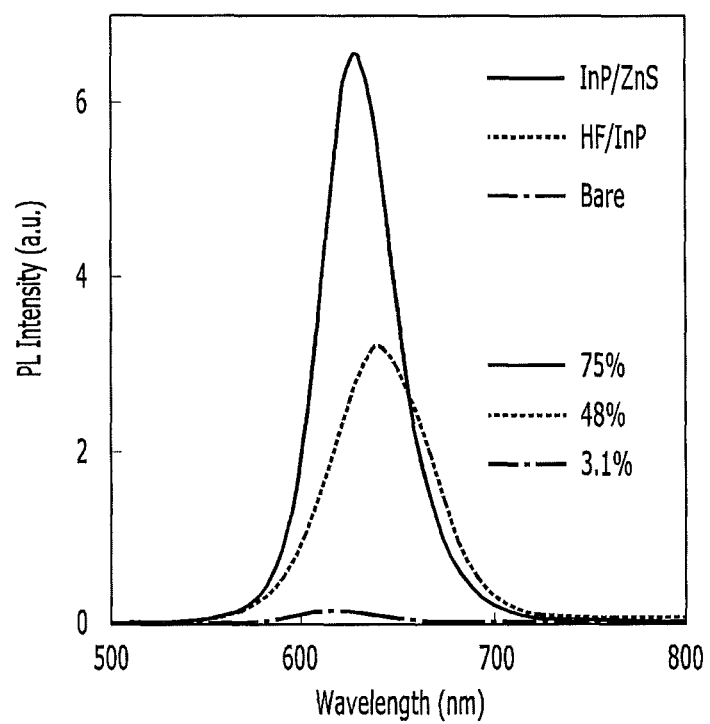
FIG. 19A and FIG. 19B shows the results of the analysis conducted in Example 1-4.
Figure 19B:
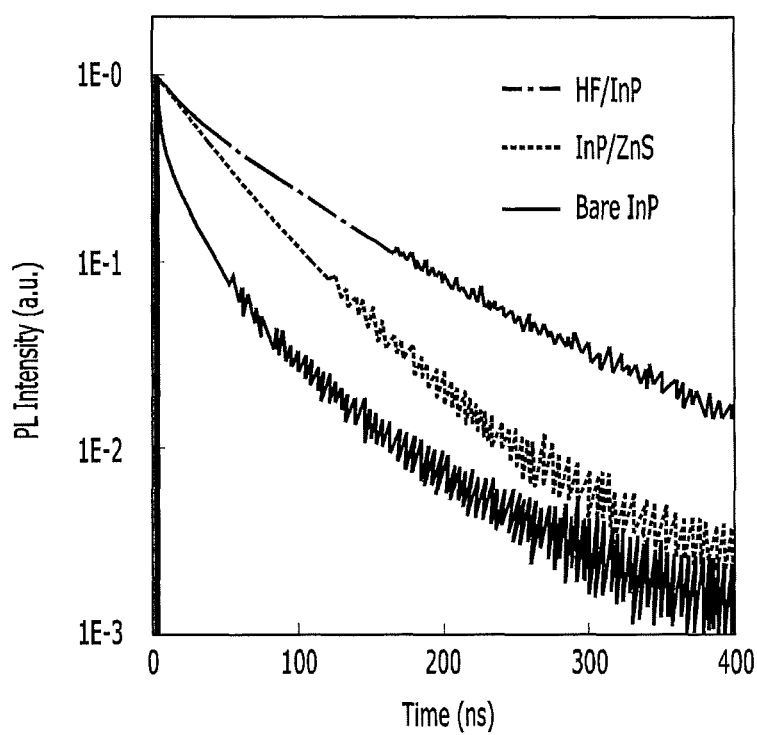

To understand the change of the PL property in InP QDs by HF treatment more closely, time-resolved PL of bare InP of Reference Example 1, HF-treated InP of Example 1, and InP/ZnS of Reference Example 4 were compared as shown in FIGS. 19A and 19B. From the logarithmic decay plots, the multi-exponential decay curve in InP QDs with low QY=1.4% is more linearized in InP/ZnS QDs with QY=75% and HF—InP QDs with QY=48%, which is quantitatively supported by the increase of β values in stretched exponential decay function fitting from 0.43 to 0.61 and 0.69, respectively. The linearization simply indicates that many non-radiative decay paths were effectively erased and the radiative decay path became dominant by ZnS shell coating and HF treatment.

Average decay times of InP, InP/ZnS, and HF—InP QDs were obtained as 10.5 ns, 14.2 ns, and 51.5 ns, respectively. In spite of the lower PL QY, the average decay rate of HF—InP QDs is much slower than that of InP/ZnS QDs. Radiative and non-radiative decay rates of the QDs estimated from the combination to of PL QY and the average decay times are summarized in the following Table 3:

TABLE 3

| | $I = I_0 \exp(-(t/\tau_0)^\beta)$ | | | | | | |
|---|---|---|---|---|---|---|---|
| | $\tau_0$ (ns) | β | <τ> (ns) | QY (%) | $k_{tot}$ (ns$^{-1}$) | $k_{rad}$ (ns$^{-1}$) | $k_{nrad}$ (ns$^{-1}$) |
| InP | 3.82 | 0.43 | 10.5 | 3.1 | 0.095 | 0.003 | 0.092 |
| InP/ZnS | 9.66 | 0.61 | 14.2 | 75 | 0.070 | 0.053 | 0.017 |
| HF-InP | 40.1 | 0.69 | 51.5 | 48 | 0.019 | 0.009 | 0.010 |

The radiative decay rate of HF-treated InP QDs is about 6 times slower than that of InP/ZnS QDs despite the just 1.8 times smaller non-radiative decay rate. This means that the emission oscillator strength in HF-treated InP QDs is 6 times smaller than the InP/ZnS QDs. In other words, HF treatment seems to contribute to the reduction of electron/hole overlap for luminescence in InP QDs as well as to PL QY enhancement. This photophysical change by HF treatment on InP QDs cannot be explained by the known etching effect.

Example 2

Fluorine Passivation of the InP QD (after 3 Times Washing)

The fluorine passivated InP quantum dots are prepared in the same manner set forth in Example 1-1, except that the InP QDs are washed with acetone three times. The PL spectrum of the obtained quantum dots are shown in FIG. 4.

Figure 4:
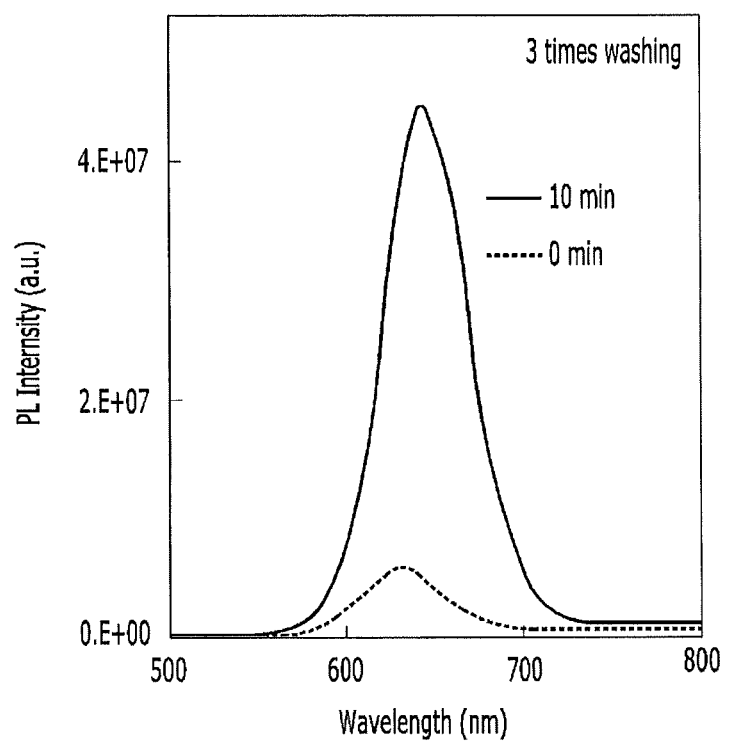
FIG. 4 is a graph of PL intensity (a.u.) versus wavelength (nm) which shows a photoluminescent spectrum of the quantum dot prepared in Example 2.

The results of FIG. 4 confirm that the fluorine passivation may occur without an excess amount of the organic ligand compound such as palmitate or TOP.

Example 3-1

Figure 5A:
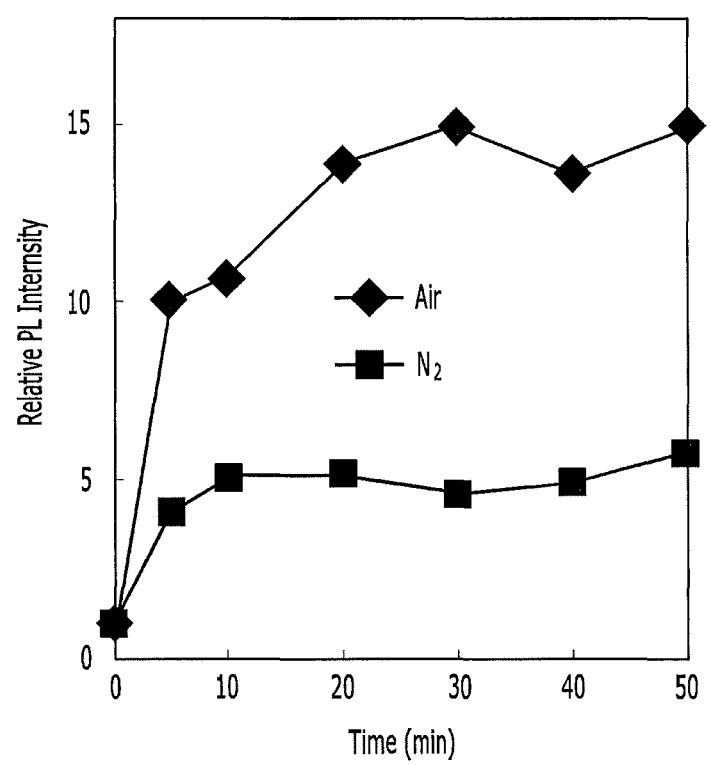
FIG. 5A is a graphs of relative PL intensity versus time (minutes, min) showing the changes in the PL intensity with the irradiation time for the quantum dots in Example 3.

Fluorine Passivation of the InP QD by Irradiation Under an Oxygen-Containing Atmosphere The fluorine passivated InP quantum dots are prepared in the same manner set forth in Example 1-2, except that the irradiation is conducted for a period of 50 min. During the irradiation, the sample is removed from the treating system every 10 min and subjected to a PL spectroscopy analysis to measure its PL intensity. The results are shown in FIG. 5A.

Example 3-2

Fluorine Passivation of the InP QD by Irradiation under a Nitrogen Atmosphere The fluorine passivated InP quantum dots are prepared in the same manner set forth in Example 1-2, except that the irradiation is conducted for a period of 50 min under a nitrogen atmosphere. During the irradiation, the sample is removed from the treating system every 10 min and is subjected to a PL spectroscopy analysis to measure its PL intensity. The results are shown in FIG. 5A.

Example 3-3

Figure 5B:
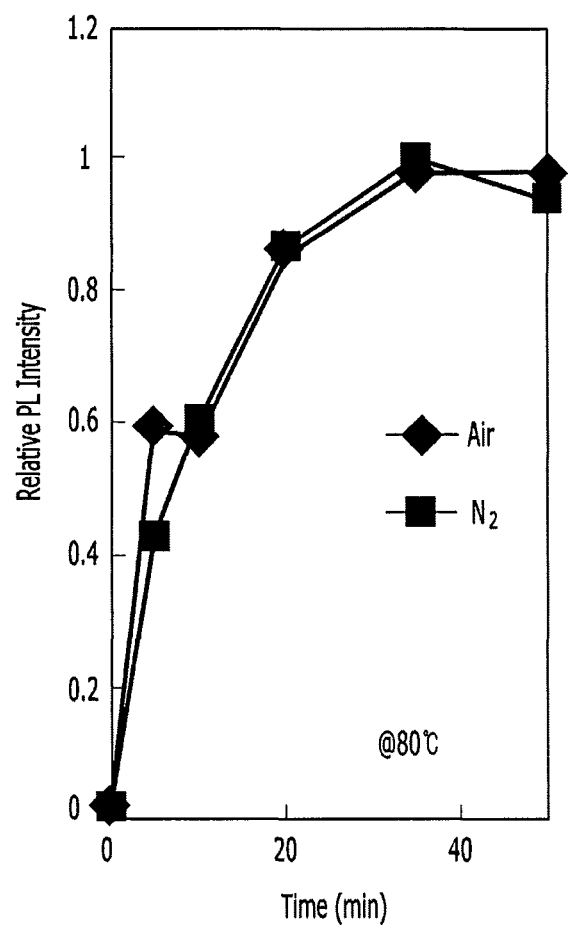
FIG. 5B is a graph of relative PL intensity versus time (min) showing the change in PL intensity with the heat-treatment time (80° C.) for the quantum dots in Example 3.

Fluorine Passivation of the InP QD by Heating under an Oxygen-Containing Atmosphere The fluorine passivated InP quantum dots are prepared in the same manner set forth in Example 1-1, except that the heating is conducted for 50 min. During the heat treating, the sample is removed from the treating system every 10 min and is subjected to a PL spectroscopy analysis to measure its PL intensity. The results are shown in FIG. 5B.

Example 3-4

Fluorine Passivation of the InP QD by Heating under a Nitrogen Atmosphere

The fluorine passivated InP quantum dots are prepared in the same manner set forth in Example 1-1 except that the heating is conducted for a time period of 50 min under a nitrogen atmosphere. During the heat treating, the sample is removed from the treating system per every 10 min and is subjected to a PL spectroscopy analysis to measure its PL intensity. The results are shown in FIG. 5B.

FIG. 5A and FIG. 5B show the variation in the PL intensity as a function of time under the conditions with $O_2$ and without $O_2$ (e.g. $N_2$ atmosphere) for both the photochemical and thermal HF treatment of InP QDs, respectively. Although PL intensity by photochemical treatment in the presence of $O_2$ is about 3 times higher than PL intensity without $O_2$, the thermal treatment was not affected by the presence or absence of $O_2$. The results imply that $O_2$ seems to work as an electron scavenger and to become singlet oxygen or superoxide in the light-induced reaction. This result suggests that the reaction pathways might be different in the photochemical and thermal treatment despite the similar PL enhancement, and the $O_2$ is not an intrinsically essential element for the reaction of InP with HF.

Example 4

[1] Using the InP QDs prepared in Reference Example 1, the F-passivated InP QDs are obtained in the same manner as set forth in Example 1-1. For the InP QDs without the fluorine passivation and the F-passivated InP QDs, the PL spectrums are shown in FIG. 6.

[2] Using the TMSP-InP QDs prepared in Reference Example 3, the F-passivated TMSP-InP QDs are prepared in the same manner as set forth in Example to 1-1. For the TMSP-InP QDs (TMSP-InP) without the fluorine passivation and the F-passivated TMSP-InP QDs (TMSP-InP-HF), the PL spectrums are shown in FIG. 6.

Figure 6:
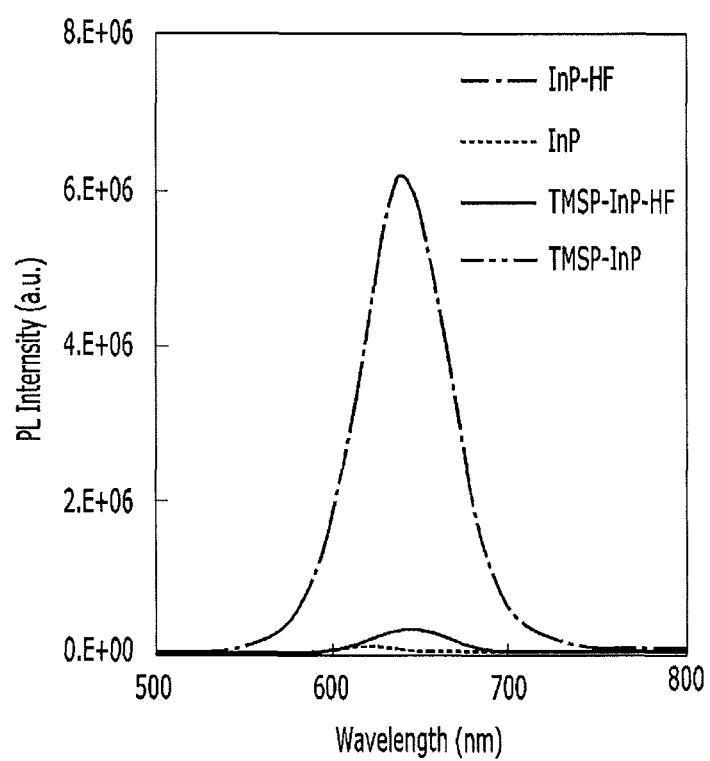
FIG. 6 is a graph of PL intensity (a.u.) versus wavelength (nm) which shows a photoluminescent spectrum of the quantum dot prepared in Example 4.

The results of FIG. 6 confirm that the InP QDs with a P-rich surface (i.e., TMSP-InP QDs) do not really show an enhancement in the quantum efficiency while the InP QDs with the surface indium atoms may show greatly increased quantum efficiency. Without wishing to be bound by theory, it is believed that the HF works on the indium sites of InP QDs rather than the phosphorous sites thereof.

Example 5

[1] Acetone is added to a toluene dispersion of the InP QDs prepared in Reference Example 1 to precipitate the QDs again (the first time of acetone washing) and the QDs are centrifuged and are then dispersed again in 4 mL of hexane to obtain a first QD dispersion. Hydrofluoric acid is dissolved in 4 mL of dimethyl sulfoxide to prepare a HF solution (the amount of HF: $4 \times 10^{-4}$ mole).

The first QD dispersion and the HF solution are placed in a Teflon vial together to produce phase-separated bi-layers consisting of hexane including InP QDs (QY=0.7%) and DMSO with HF, which is then shaken for 1 min to mix the first QD dispersion and the HF solution thoroughly. The resulting mixture is left alone either under mild heating or under illumination (e.g., white light from a Xe lamp).

Figure 7A:
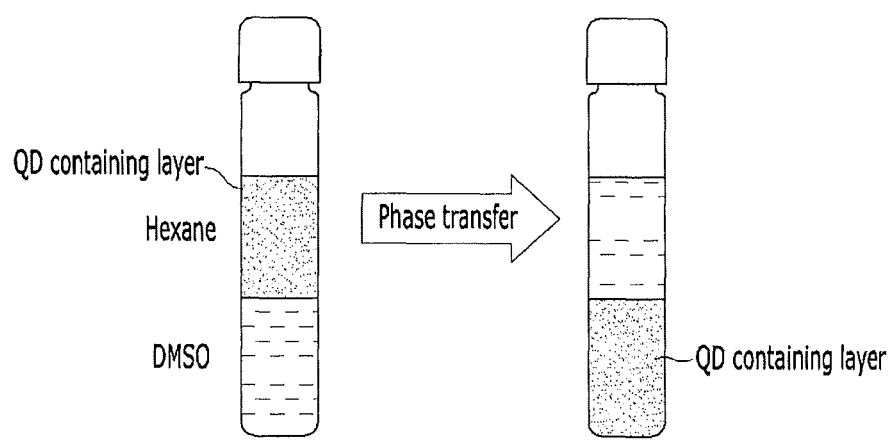
FIG. 7A is an illustration showing the phase transition phenomenon occurring in Example 5.

InP QDs quickly aggregated in the interface between hexane and DMSO right after the shaking, and clearly dissolved into the HF-DMSO solution during the irradiation (or the heating). Therefore, as illustrated in FIG. 7A, the fluorine treated quantum dots are transferred (i.e., phase-transferred) from the first QD solution to to the phase of the HF solution to provide a second QD dispersion wherein the fluorine treated QDs are dispersed in DMSO. Without HF in DMSO, InP QD in hexane do not move to DMSO at all even after vigorous mixing. That is, the phase transfer results from the reaction of InP QDs with HF, and accordingly the hydrophobic surface is changed to hydrophilic. Therefore, the fluorine treated QDs may be dispersed in water or a water miscible organic solvent.

Figure 7B:
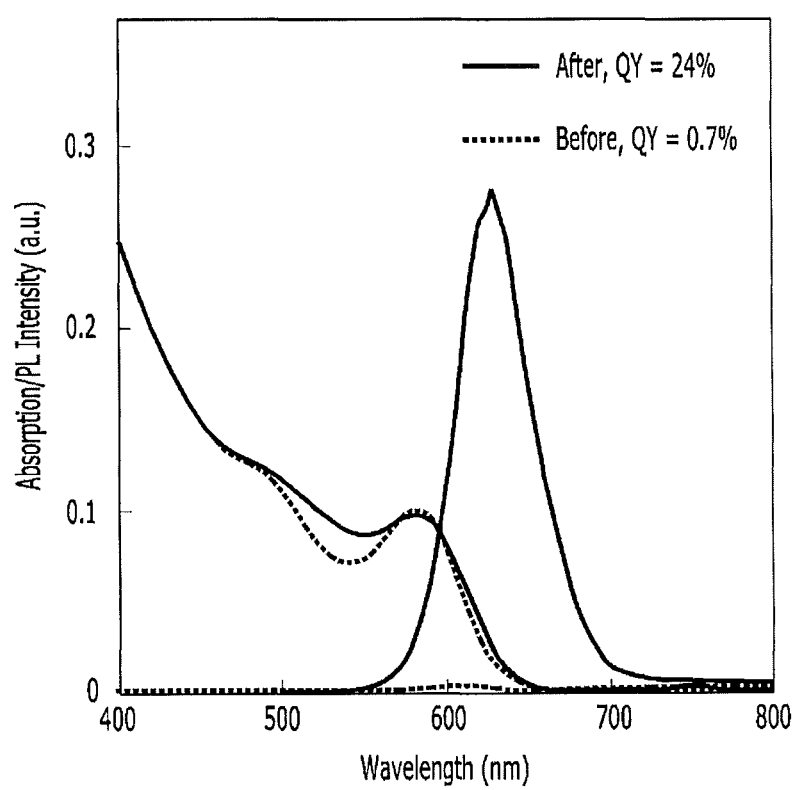
FIG. 7B is a graph of absorption/PL Intensity (a.u.) versus wavelength (nm) which shows a photoluminescence spectrum of the HF treated quantum dots prepared in Example 5.

The PL spectrums of the InP QDs of Reference Example 1 and the fluorine treated InP QDs as obtained are shown in FIG. 7B. The results of FIG. 7B confirm that the fluorine treated InP QDs may show greatly increased quantum efficiency. Final PL QY of InP QDs dissolved in DMSO was improved to 24%.

Figure 8:
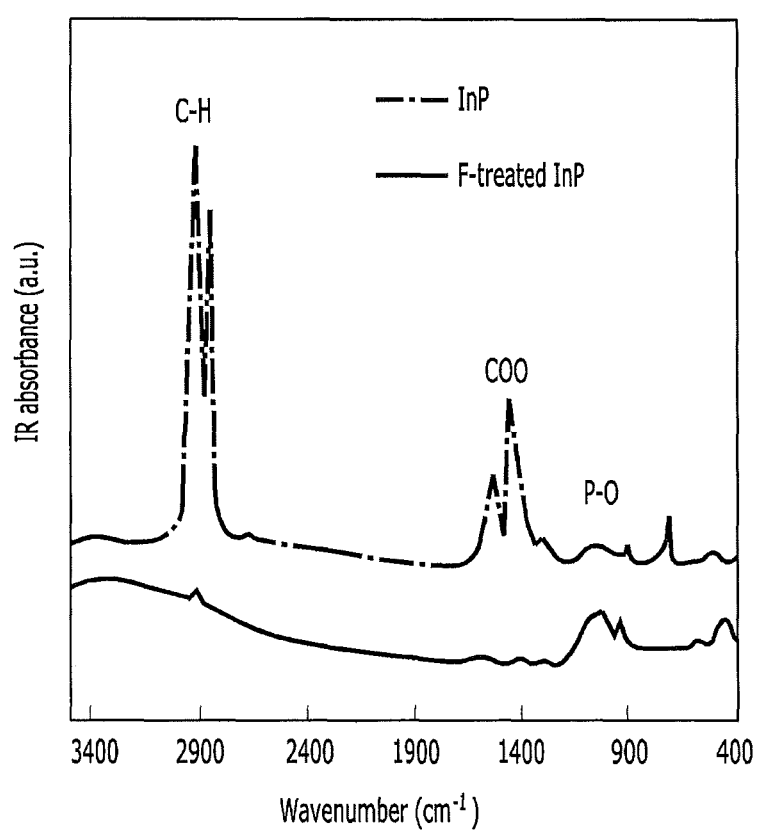
FIG. 8 is a graph of infrared (IR) absorbance (a.u.) versus wavenumber (reciprocal centimeters, $cm^{-1}$) which shows Fourier transform infrared spectroscopy (FT-IR) spectrums of the quantum dots prepared in Reference Example 1 and Example 5, respectively.

[2] An FT-IR spectroscopy analysis is made for the InP QDs of Reference Example 1 and the fluorine passivated InP QDs, and the results are shown in FIG. 8 which confirm that in the FT-IR spectrum of the fluorine passivated InP QDs, almost all of the signals of the organic substances that are present in the FT-IR spectrum of the InP QDs of Reference Example 1 are completely removed.

Figure 9:
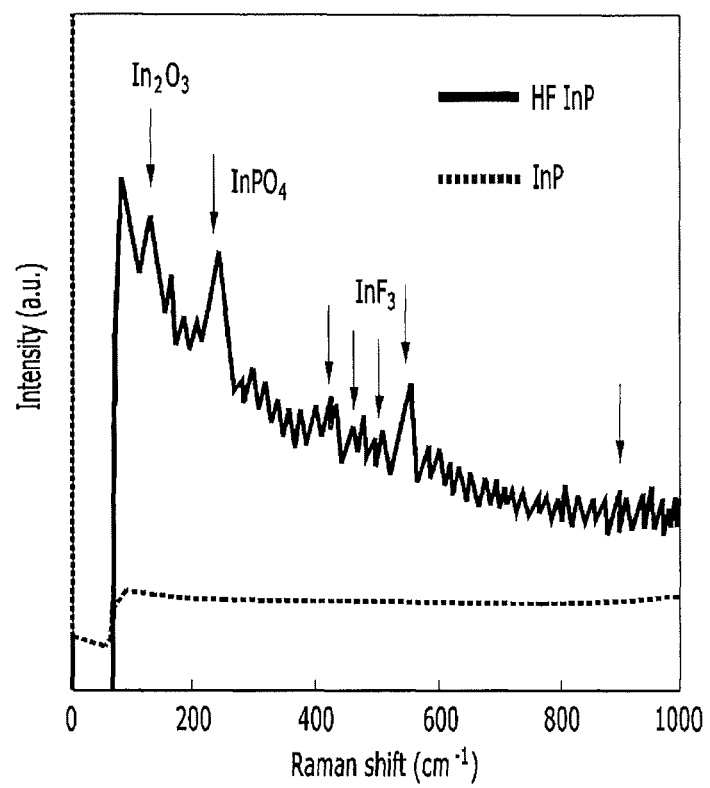
FIG. 9 is a graph of intensity (a.u.) versus raman shift ($cm^{-1}$) which shows the Raman spectrum of the quantum dots prepared in Reference Example 1 and Example 5, respectively.

[3] A Raman spectroscopy analysis is made for the InP QDs of Reference Example 1 and the fluorine passivated InP QDs, and the results are shown in FIG. 9 which confirm that in the Raman spectrum of the fluorine passivated InP QDs, new inorganic signals (e.g., for an oxide such as $In_2O_3$ and for a fluoride such as $InF_3$) begin to appear.

Figure 10A:
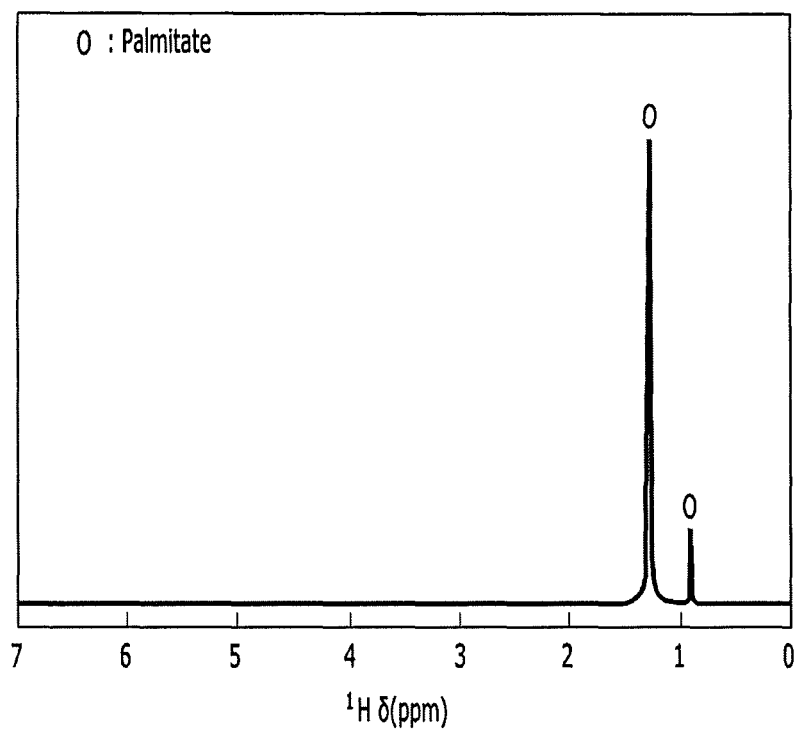
FIG. 10A, FIG. 10B, and FIG. 11 are nuclear magnetic resonance (NMR) spectrum of the quantum dots prepared in Reference Example 1 and Example 5, respectively.
Figure 10B:
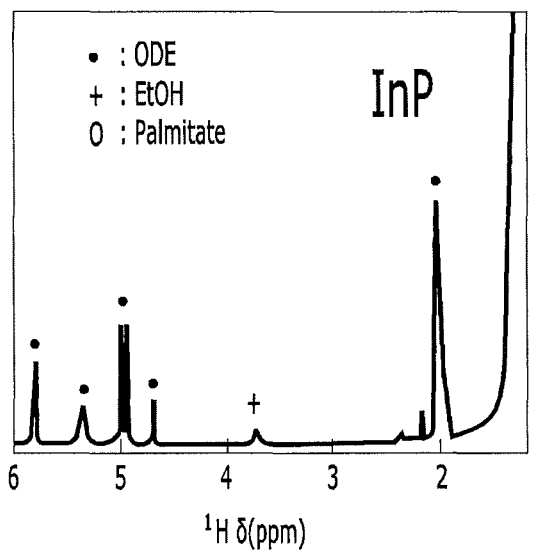
Figure 11:
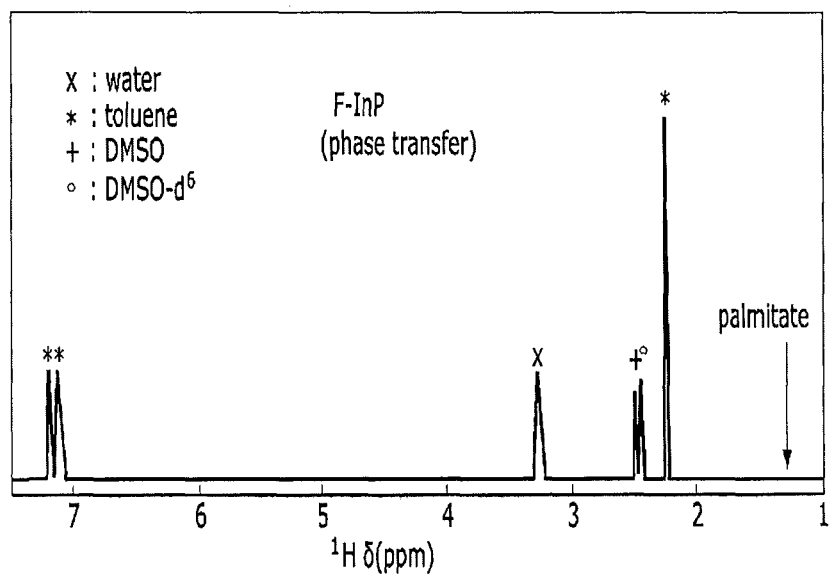

[4] An NMR spectroscopy analysis is made for the InP QDs of Reference Example 1 and the fluorine passivated InP QDs, and the results are shown in FIG. 10A, FIG. 10B, and FIG. 11 which confirm that in the NMR spectrum of the fluorine passivated InP QDs, the signals for the organic ligand (i.e., palmitate) disappear and to the signals for DMSO are detected.

Example 6

[1] The fluorine passivated InAs quantum dots are prepared in the same manner as Example 5, except that the InAs QDs prepared in Reference Example 2 are used instead of the InP QDs of Reference Example 1.

Figure 12:
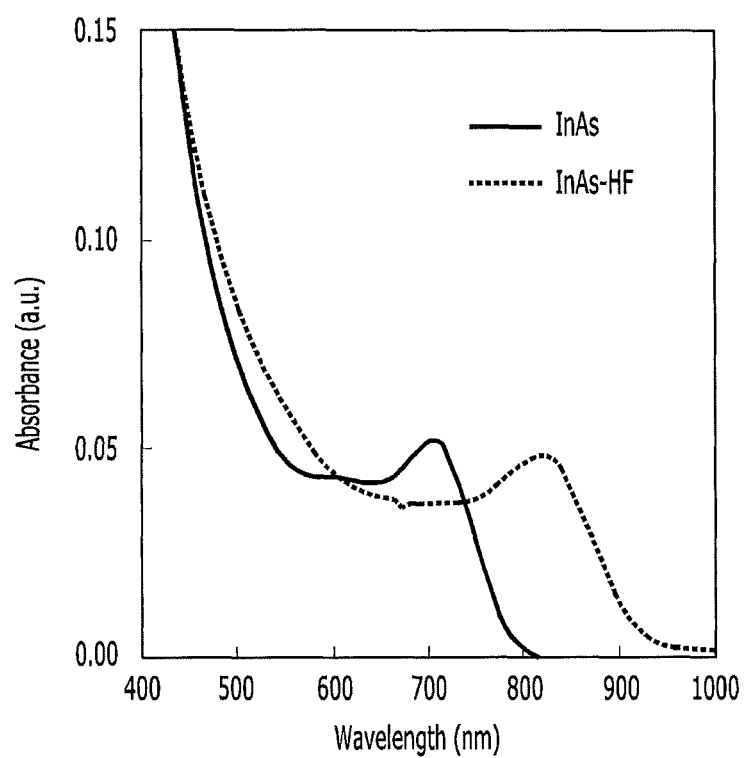
FIG. 12 is a graph of absorbance (a.u.) versus wavelength (nm) which shows UV absorption spectrums of the quantum dots prepared in Reference Example 2 and Example 6, respectively.

[2] A UV absorption spectroscopy analysis is made for the fluorine passivated InAs quantum dots and the InAs QDs of Reference Example 2, and their UV absorption spectrums are shown in FIG. 12. From the results of FIG. 12, it is confirmed that the fluorine passivated InAs QDs (InAs—HF) show an absorption peak wavelength that is shifted more toward the longer wavelength region (i.e., red-shifted) than that of the InAs QDs (InAs) of Reference Example 2.

Figure 13:
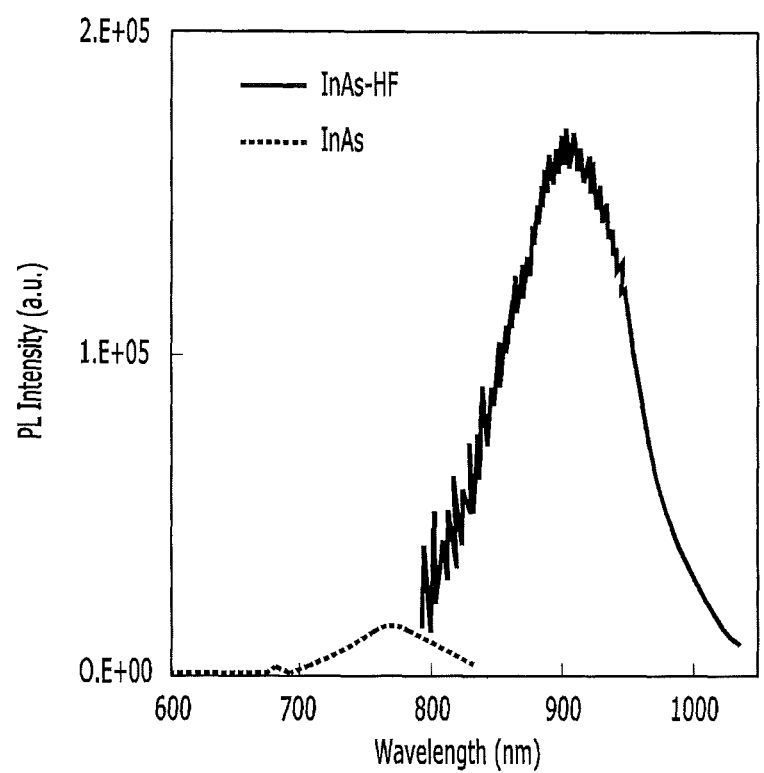
FIG. 13 is a graph of PL Intensity (a.u.) versus wavelength (nm) which shows the photoluminescence spectrum of the quantum dots prepared in Reference Example 2 and Example 6, respectively.

[3] The PL spectrums of the fluorine passivated InAs quantum dots (InAs—HF) and the InAs QDs (InAs) of Reference Example 2 are shown in FIG. 13. The results of FIG. 13 confirm that the maximum PL peak wavelength of the fluorine passivated InAs quantum dots are shifted toward the longer wavelength region (i.e., red-shifted) in comparison with that of the InAs QDs of Reference Example 2. The maximum PL peak intensity of the InAs QDs of Reference Example 2 is 1.5% while the maximum PL peak intensity of the fluorine passivated InAs quantum dots is 11%, which is 7 times higher than that of the InAs QDs of Reference Example 2.

Figure 14:
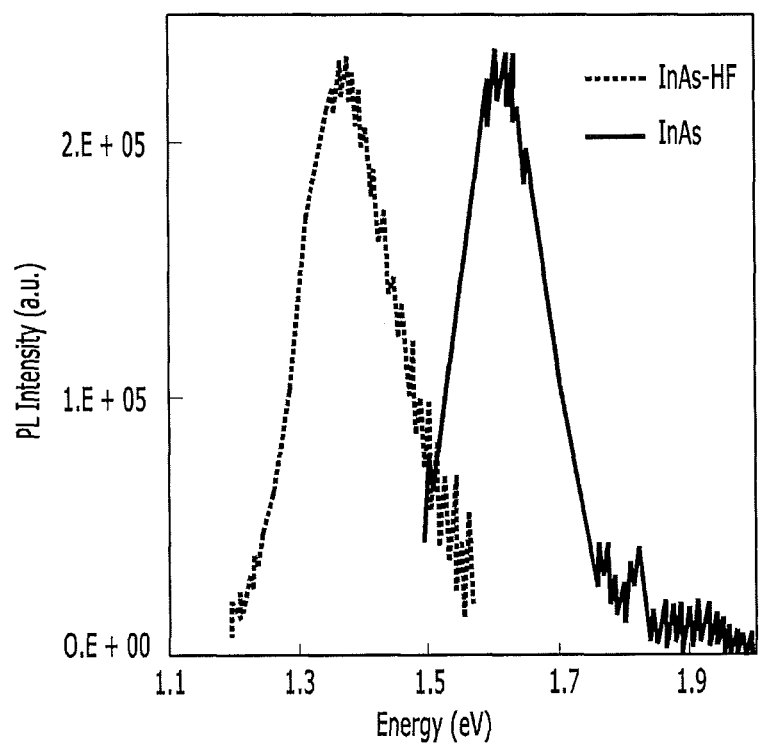
FIG. 14 is a graph of nominal PL Intensity (a.u.) versus wavelength (nm) shows photoluminescence spectrums of the quantum dots prepared in Reference to Example 2 and Example 6, respectively.

[4] A normalized PL spectrum for the PL spectrum of FIG. 13 with respect to the maximum PL peak intensity is shown in FIG. 14. The results of FIG. 14 confirm that the FWHM of the fluorine passivated InAs quantum dots is substantially the same as that of the InAs QDs of Reference Example 2.

Example 7

[1] 4 mL of a dispersion (QD crude 10 μL+Toluene 990 μL) including the InAs QDs of Reference Example 2 and having optical density of 0.15 are washed with acetone and ethanol 2 times and completely dried for 5 min under vacuum.

The dried InAs QDs are moved into a glove box, and 20 mg of the dried InAs QDs are dispersed in 1 mL of octane and spin-coated onto a substrate of 1 cm×1 cm at 2,000 rotations per minute (rpm) for 15 second (s). The coated QD film is immersed in a 0.03 M ethanedithiol (EDT) acetonitrile solution to repeat a ligand exchange of the oleic acid with the EDT five times to produce a 40 nm thick InAs QD film (hereinafter QD film 1).

A $1.4 \times 10^{-4}$ M HF-acetonitrile solution (40% HF in water 7 μL+acetonitrile 1 mL) is dripped on the QD film 1, which is then illuminated using a UV lamp for 30 s and spin-coated at 2000 rpm for 1 min to produce the InAs QD film treated with EDT and fluorine (hereinafter, QD film 2).

Figure 15A:
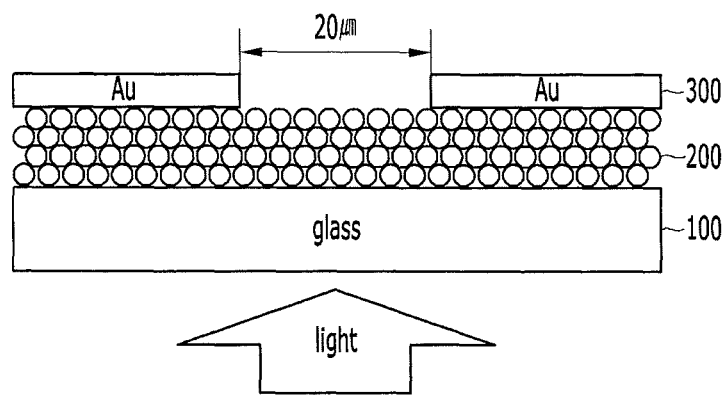
FIG. 15A is a cross-sectional view schematically illustrating the device manufactured in Example 7.

On each of the QD film 1/glass and the QD film 2/glass, a 100 nm thick Au electrode with a channel length of 20 micrometers (pm) is vapor-deposited using a thermal evaporator to produce Device 1 and Device 2, respectively. The cross-section of the devices is illustrated in FIG. 15A. As shown in FIG. 15A, the QD film 200 is deposited on a glass substrate 100, and the electrode (Au) 300 having a channel length of 20 μm is deposited on the QD film 200.

A voltage is applied on each of Device 1 and Device 2 under a dark state (no light) and an illuminated state (AM 1.5) and a dark current and a photocurrent are measured respectively. The results are shown in FIG. 15B.

Figure 15B:
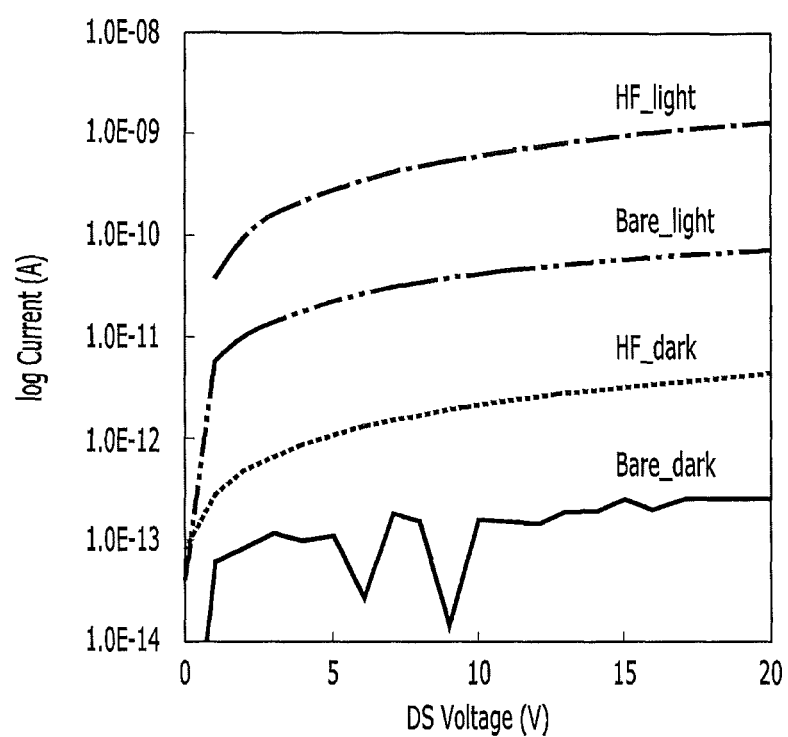
FIG. 15B is a graph of output (log) current (amperes, A) versus DS voltage (volts, V) plotting the dark current and the photocurrent of the device prepared in Example 7 when a voltage is applied thereto.

[2] From the results of FIG. 15B, the following are confirmed.

Device 1 including the fluorine treated QD film (HF) shows a dark current and a photocurrent which are 10 times higher than the dark current and the photocurrent of Device 2 (Bare) including only the QD film treated EDT. The increase in the dark current implies that the interaction between the fluorine treated quantum dots increases and thereby the conductivity may also increase. The increase in the photocurrent implies that the concentration of the defects on the individual QD decreases together with the increase of the conductivity. Without wishing to be bound by any theory, it is believed that the effect of the HF treatment may contribute to improving the properties of the QD film in two ways, i.e., by decreasing the distance between the particles and eliminating the surface defect.

Example 8

[1] InAs QD samples having different particle sizes (average diameters of 3.3 nm, 4.3 nm, 5.1 nm, 6.5 nm, and 6.8 nm) are prepared in a similar manner to Reference Example 2. Each sample is subjected to a complete phase transfer as described in Example 6 using a HF solution of DMSO to prepare a sample including the fluorine passivated InAs QDs.

Each sample including the fluorine passivated InAs QDs is spin-coated onto a SiO$_2$ (300 nm)/Si substrate having a patterned Au electrode with a channel length of 20 μm to prepare a bottom gate-type field-effect transistor (FET). After the spin-coating, the FET is heated at 200° C. for 10 min to remove the remaining DMSO and improve the contact between the QDs.

For comparison, each of the InAs QD samples having different sizes without to being subjected to the phase transfer is spin coated onto the aforementioned FET electrode and treated with EDT as set forth in Example 7 and then heated at 200° C. for 10 min.

Figure 16:
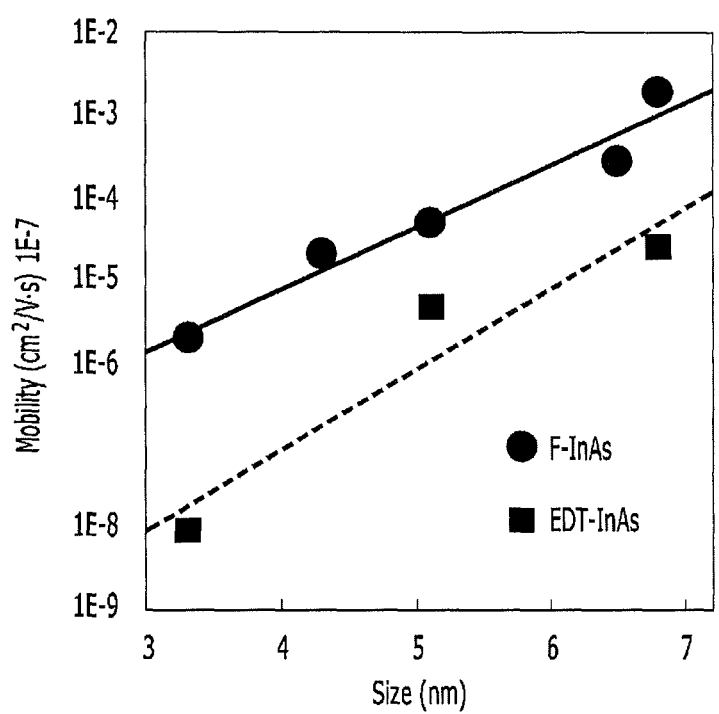
FIG. 16 shows a graph plotting the charge mobility which occurs upon illumination of the device prepared in Example 8.

For each of the FETs, a transfer curve plotting a current at different voltages is determined to measure the electron mobility, and the change in electron mobility with increasing particle size is shown in FIG. 16.

[2] The results of FIG. 16 confirm the following. In both cases, the FET including the fluorine treated InAs QD film and the FET including the EDT-treated InAs QD film, the mobility increases as the size of QDs increases. The FETs including the fluorine treated InAs QD film have 10 to 100 times higher mobility than the mobility of the FETs including the EDT-treated InAs QD film.

Without wishing to be bound by any theory, it is believed that the changes in the electron mobility depending on the size of the QD reflects that the charge transfer in the InAs QD film decreases as the activation energy of electron hopping, determined by the charge capacity of the individual QD, increases. In addition, it is believed that the increased mobility in the F-treated InAs QD film comes from the fact that the F-treated InAs QDs have a decreased number of defects.

What is claimed is:

1. An indium-containing quantum dot comprising a compound represented by Chemical Formula 1:

$$In_{1-x}M_xA \qquad \text{Chemical Formula 1}$$

wherein, in Chemical Formula 1, M is aluminum, gallium, yttrium, or scandium, A is nitrogen, phosphorous, arsenic, antimony, bismuth, or a combination thereof, and X is greater than or equal to 0 and less than 1, wherein the indium-containing quantum dot comprises fluorine and oxygen, each of which are bonded to a surface of the indium-containing quantum dot, wherein an amount of the fluorine is greater than or equal to about 10 atomic percent, based on a total number of indium atoms in the indium-containing quantum dot, as determined by Rutherford backscattering analysis, wherein an amount of the oxygen is between about 5 atomic percent and about 50 atomic percent, based on the total number of indium atoms in the indium-containing quantum dot, as determined by Rutherford backscattering analysis, and wherein the indium-containing quantum dot does not include trioctylphosphine oxide.

2. The indium-containing quantum dot of claim 1, wherein in Chemical Formula 1, the A is phosphorous.

3. The indium-containing quantum dot of claim 1, wherein in Chemical Formula 1, the A is arsenic or antimony.

4. The indium-containing quantum dot of claim 1, wherein the indium-containing quantum dot has a ratio of indium atoms to the A atoms greater than or equal to about 1.2, as determined by Rutherford backscattering analysis.

5. The indium-containing quantum dot of claim 1, wherein the amount of the fluorine is greater than or equal to about 40 atomic percent, based on the total number of indium atoms in the indium-containing quantum dot, as determined by Rutherford backscattering analysis, and wherein the amount of the oxygen is about 30 atomic percent to about 50 atomic percent, based on the total number indium atoms in the indium-containing quantum dot, as determined by Rutherford backscattering analysis.

6. The indium-containing quantum dot of claim 1, wherein the indium-containing quantum dot comprises a water-miscible organic solvent which is bound to the surface of the indium-containing quantum dot.

7. The indium-containing quantum dot of claim 6, wherein the water-miscible organic solvent comprises dimethyl sulfoxide, dimethyl formamide, formamide, methyl formamide, dimethyl acetamide, diethylene triamine, or a combination thereof.

8. The indium-containing quantum dot of claim 1, wherein the indium containing quantum dot does not comprise a hydrophobic ligand which is coordinated with a surface of the quantum dot, wherein the hydrophobic ligand comprises a trialkylphosphine having at least 24 carbon atoms, a trialkylphosphine oxide having at least 24 carbon atoms, a fatty acid having at least 8 carbon atoms, a thiol compound having at least 8 carbon atoms, an amine having at least 8 carbon atoms, a phosphorous acid having at least 8 carbon atoms, or a combination thereof.

9. The indium-containing quantum dot of claim 1, wherein the indium-containing quantum dot does not have a shell disposed on the surface of the indium-containing quantum dot, and the shell comprises a semiconductor nanocrystal having a greater bandgap energy than the compound represented by Chemical Formula 1.

10. The indium-containing quantum dot of claim 1, wherein the indium-containing quantum dot comprises indium on the surface of the indium-containing quantum dot in an amount of greater than or equal to about 10 percent, based on a total amount of the indium in the quantum dot.

11. The indium-containing quantum dot of claim 1, wherein the indium-containing quantum dot has a quantum yield of greater than or equal to about 10 percent.

12. The indium-containing quantum dot of claim 1, wherein the indium-containing quantum dot has a photoluminescence peak wavelength that is longer than a photoluminescence peak wavelength of a same quantum dot without the fluorine bonded to the surface thereof.

13. The indium-containing quantum dot of claim 1, wherein the photoluminescence peak wavelength of the indium-containing quantum dot is greater than or equal to about 800 nanometers.

14. A method of producing the indium-containing quantum dot of claim 1, the method comprising:
providing an indium-containing quantum dot comprising the compound represented by Chemical Formula 1;
washing the indium-containing quantum dot with a non-solvent;
dispersing the washed indium-containing quantum dot in a mixed solvent comprising a non-polar solvent and a polar solvent to prepare a quantum dot dispersion;
providing a HF-containing solution;
injecting the HF-containing solution into the quantum dot dispersion to prepare a mixture comprising the quantum dot dispersion and the HF-containing solution; and
irradiating the mixture comprising the quantum dot dispersion and the HF-containing solution with a light source or heating the mixture of the quantum dot dispersion and the HF-containing solution to produce the indium-containing quantum dot,
wherein the indium-containing quantum dot does not include trioctylphosphine oxide.

15. The method of claim 14, wherein
the non-solvent comprises acetone, ethanol, methanol, isopropyl alcohol, acetonitrile, or a combination thereof,
the polar solvent comprises propanol, butanol, or a combination thereof, and
the non-polar solvent comprises toluene, hexane, cyclohexane, chloroform, or a combination thereof.

16. The method of claim 14, wherein a number of fluorine molecules in the HF-containing solution is about 10 times to about 10,000 times greater than a number of the indium-containing quantum dots.

17. A method of producing the indium-containing quantum dot of claim 1, the method comprising:
providing an indium-containing quantum dot comprising the compound represented by Chemical Formula 1;
washing the indium-containing quantum dot with a non-solvent;
dispersing the washed indium-containing quantum dot in a first organic solvent which is water immiscible to obtain a first quantum dot dispersion;
dissolving HF in a second organic solvent that is water miscible to obtain a HF solution;
contacting the first quantum dot dispersion with the HF solution; and
transferring the indium-containing quantum dots from the first quantum dot dispersion to the HF solution, to provide a second quantum dot dispersion comprising the indium-containing quantum dots in the second organic solvent to produce the indium-containing quantum dot.

18. The method of claim 17, wherein the non-solvent comprises acetone, ethanol, methanol, isopropyl alcohol, acetonitrile, or a combination thereof, wherein the first organic solvent comprises hexane, cyclohexane, or a combination thereof, and wherein the second organic solvent comprises dimethyl sulfoxide, dimethyl to formamide, formamide, methyl formamide, dimethyl acetamide, diethylene triamine, or a combination thereof.

19. The method of claim 17, wherein in the HF solution, a number of fluorine molecules in the HF solution may be about 1000 times to about 1,000,000 times greater than a number of the indium-containing quantum dots.

20. A device comprising the indium-containing quantum dot of claim 1.

21. The device of claim 20, wherein the device is a solar cell, a photo-detector, a field effect transistor, a flash memory, or a photoelectric chemical device.

22. The indium-containing quantum dot of claim 1, wherein an amount of fluorine is greater than an amount of oxygen, as determined by Rutherford backscattering analysis.

23. The indium-containing quantum dot of claim 1, wherein the indium-containing quantum dot does not include octane thiol.

24. The method of claim 14, wherein the heating or the irradiation is conducted for about 3 minutes to 50 minutes.

25. The method of claim 14, wherein the indium-containing quantum dots does not include octane thiol.

26. The method of claim 17, wherein the indium-containing quantum dots does not include trioctylphosphine oxide.

* * * * *